US011892522B2

(12) United States Patent
Surve et al.

(10) Patent No.: US 11,892,522 B2
(45) Date of Patent: Feb. 6, 2024

(54) SYSTEMS AND METHODS FOR MONITORING AND ESTIMATING SERVICE LIFE OF ELECTRICAL FUSES

(71) Applicant: EATON INTELLIGENT POWER LIMITED, Dublin (IE)

(72) Inventors: Shubham Pandurang Surve, Maharashtra (IN); Prashant Sanjay Shelke, Maharashtra (IN)

(73) Assignee: Eaton Intelligent Power Limited, Dublin (IE)

( * ) Notice: Subject to any disclaimer, the term of this patent is extended or adjusted under 35 U.S.C. 154(b) by 33 days.

(21) Appl. No.: 17/532,553

(22) Filed: Nov. 22, 2021

(65) Prior Publication Data

US 2023/0160977 A1   May 25, 2023

(51) Int. Cl.
*G01R 31/74* (2020.01)
*H02H 3/04* (2006.01)

(52) U.S. Cl.
CPC ............. *G01R 31/74* (2020.01); *H02H 3/046* (2013.01)

(58) Field of Classification Search
CPC ................................ G01R 31/74; H02H 3/046
See application file for complete search history.

(56) References Cited

U.S. PATENT DOCUMENTS

| | | | |
|---|---|---|---|
| 7,986,218 B2* | 7/2011 | Watters | G01D 5/48 324/693 |
| 8,762,083 B2 | 6/2014 | Rodseth et al. | |
| 9,989,579 B2 | 6/2018 | Douglass et al. | |
| 10,102,995 B2* | 10/2018 | Rosenquist | H01H 85/0241 |
| 10,598,703 B2 | 3/2020 | Douglass et al. | |
| 11,515,116 B2* | 11/2022 | Lee | H02H 1/0061 |
| 2005/0088271 A1* | 4/2005 | Lau | G01R 31/74 337/206 |
| 2006/0077607 A1 | 4/2006 | Henricks et al. | |
| 2009/0231764 A1* | 9/2009 | Banting | H02H 7/16 340/638 |
| 2010/0019913 A1 | 1/2010 | Rodseth et al. | |
| 2010/0246080 A1 | 9/2010 | Nelson et al. | |

(Continued)

FOREIGN PATENT DOCUMENTS

| CN | 111987689 A | 11/2020 |
|---|---|---|
| WO | 2015189572 A1 | 12/2015 |

*Primary Examiner* — Akm Zakaria
(74) *Attorney, Agent, or Firm* — Baker Botts L.L.P.

(57) ABSTRACT

A fuse monitoring system for monitoring a fuse is provided. The system includes a fuse monitoring assembly and a fuse monitoring computing device. The fuse monitoring assembly includes at least one sensor configured to measure fuse data associated with the fuse, the fuse data including operational data of the fuse and environmental data of an environment in which the fuse locates, the environmental data including shock and vibrations. The fuse monitoring assembly also includes at least one processor configured to transmit the fuse data to a remote computing device. The fuse monitoring computing device is positioned remotely from the fuse monitoring assembly, the fuse monitoring computing device including at least one processor in communication with at least one memory device. The fuse monitoring computing device is programmed to receive, from the fuse monitoring assembly, the fuse data, analyze the fuse data, and generate a fuse message based on the analysis.

20 Claims, 14 Drawing Sheets

(56) References Cited

U.S. PATENT DOCUMENTS

| | | | |
|---|---|---|---|
| 2016/0299186 A1* | 10/2016 | Fan | G01R 31/74 |
| 2017/0263406 A1* | 9/2017 | Rosenquist | H01H 85/32 |
| 2017/0363674 A1* | 12/2017 | Douglass | G01R 31/74 |
| 2019/0369155 A1 | 12/2019 | Sirigineedi et al. | |
| 2019/0371560 A1 | 12/2019 | Sirigineedi et al. | |
| 2021/0174973 A1* | 6/2021 | Munoz | G16Y 40/10 |
| 2022/0349959 A1* | 11/2022 | Leroy | G01R 31/74 |

* cited by examiner

SYSTEMS AND METHODS FOR MONITORING AND ESTIMATING SERVICE LIFE OF ELECTRICAL FUSES

BACKGROUND

The field of the disclosure relates generally to monitoring systems for electrical power systems, and more particularly to systems, assemblies, and methods for monitoring of electrical circuit protection fuses.

Fuses are widely used as overcurrent protection devices to prevent costly damage to electrical circuits. Fuse terminals typically form an electrical connection between an electrical power source or power supply and an electrical component or a combination of components arranged in an electrical circuit. One or more fusible links or elements, or a fuse element assembly, is connected between the fuse terminals, so that when electrical current flowing through the fuse exceeds a predetermined limit, the fusible elements melt and open one or more circuits through the fuse to prevent electrical component damage.

Fuse failure in electric-powered vehicles can either be a nuisance or result in an emergency. Fuses in electric-powered vehicles are subjected to temperature fluctuations, humidity, shock and vibration, potentially causing fuse fatigue and decreasing the service life of the fuse. In some other known applications, electrical enclosures house electrical components such as fuses inside. For example, in hazardous industrial environments such as mines, refineries and petroleum chemical plants, ignitable gas, vapors, dust or otherwise flammable substances are present in the ambient environment of the electrical enclosure, and the electrical enclosures are subject to temperature fluctuations, humidity, potentially causing fuse fatigue and decreasing the service life of the fuse.

Known fuse monitoring systems are disadvantaged in some aspect to meet the needs of challenging applications such as those described, they remain disadvantaged and improvements are desired.

BRIEF DESCRIPTION OF THE DRAWINGS

Non-limiting and non-exhaustive embodiments are described with reference to the following Figures, wherein like reference numerals refer to like parts throughout the various drawings unless otherwise specified.

DETAILED DESCRIPTION

Figure 1:
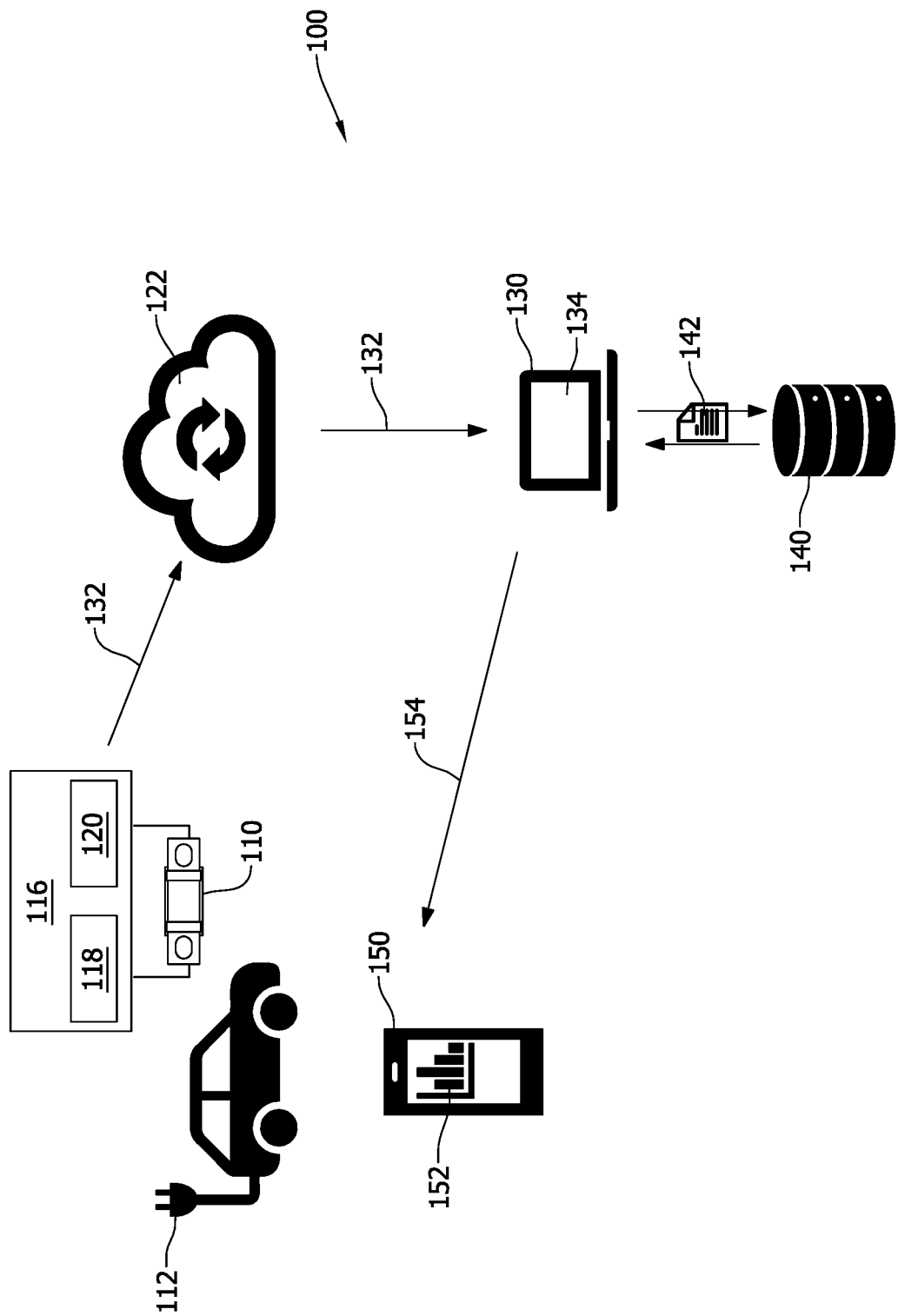
FIG. 1 is a schematic diagram of an exemplary fuse monitoring system.

Recent advancements in electric vehicle (EV) technologies, present unique challenges for fuse manufacturers. Electric vehicle manufacturers are seeking fusible circuit protection for electrical power distribution systems operating at voltages much higher than conventional electrical power distribution systems for vehicles, while simultaneously seeking less costly fuses with effective monitoring functionality to facilitate detection of impending failure conditions, for example, to meet electric vehicle specifications and demands.

Electrical power systems for conventional, internal combustion engine-powered vehicles operate at relatively low voltages, typically at or below about 48 VDC. Electrical power systems for electric-powered vehicles, referred to herein as electric vehicles (EVs), however, operate at much higher voltages. The relatively high voltage systems (e.g., 200 VDC and above) of EVs generally enables the batteries to store more energy from a power source and provide more energy to an electric motor of the vehicle with lower losses (e.g., heat loss) than conventional batteries storing energy at 12 volts or 24 volts used with internal combustion engines, and more recent 48 volt power systems.

EV original equipment manufacturers (OEMs) employ circuit protection fuses to protect electrical loads in all-battery electric vehicles (BEVs), hybrid electric vehicles (HEVs) and plug-in hybrid electric vehicles (PHEVs). Across each EV type, EV manufacturers seek to maximize the mileage range of the EV per battery charge while reducing cost of ownership. Accomplishing these objectives turns on the energy storage and power delivery of the EV system, as well as the cost, size, volume, and mass of the vehicle components that are carried by the power system. Smaller, more affordable, and/or lighter vehicles will more effectively meet these demands than larger, more expensive, and heavier vehicles, and as such all EV components are now being scrutinized for potential size, weight, and cost savings.

Generally speaking, more complex electrical components with monitoring systems tend to have higher associated material costs, higher finished component costs, occupy an undue amount of space, and introduce greater mass that directly reduces the vehicle mileage per single battery charge in EV power systems. Known high voltage circuit protection fuses incorporating aspects of performance and service life monitoring are, however, relatively complex, expensive, and relatively large. Historically, and for good reason, conventional circuit protection fuses have also tended to increase in complexity, cost, and size to meet the demands of high voltage power systems as opposed to lower voltage systems. As such, existing fuses needed to protect high voltage EV power systems tend to be much larger than the existing fuses needed to protect the lower voltage power systems of conventional, internal combustion engine-powered vehicles. Smaller or more compact high voltage power fuses incorporating performance and service life monitoring features are desired to meet the needs of EV manufacturers, without sacrificing circuit protection performance and reliability.

Electrical power systems for state of the art EVs may operate at voltages as high as 450 VDC. The increased power system voltage desirably delivers more power to the EV per battery charge. Operating conditions of electrical fuses in such high voltage power systems are much more severe, however, than lower voltage systems. Specifically, specifications relating to electrical arcing conditions as the fuse opens can be particularly difficult to meet for higher voltage power systems, especially when coupled with the industry preference for reduction in the size of electrical fuses.

Temperature cycling, caused by fluctuations in ambient temperature and current cycling, imposed on power fuses by state of the art EVs also tend to impose mechanical strain and wear that can lead to shortening of the fuse's expected service life and premature failure of a conventional fuse element due to fuse element fatigue. Fuses used in EV applications are also exposed to environmental conditions that influence the expected service life and/or affect the functional performance of the fuse. For example, fuses used in an EV power system are exposed to the shock and vibration caused by movement of the EV during travel, potentially further contributing to fatigue and reduced service life of the fuse. Fuses are also exposed to fluctuations in ambient temperature and humidity in an EV power system that may also contribute to fuse fatigue decrease the service life of the fuse.

While known power systems incorporating fuse temperature and service life monitoring features are known, they are disadvantaged in some aspects for desirable use in high voltage circuitry in state of the art EV applications. In particular, known monitoring assemblies that account for environmental conditions of the fuse in addition to operational parameters to determine fuse service life and/or assess fuse performance are too large, too complicated, or prohibitively expensive or unreliable in certain aspects to meet the needs of EV power systems. Long felt but unresolved needs to meet the particular needs of EV power systems have therefore not been completely resolved in the marketplace. Accordingly, with the goal of replacing fatigued fuses prior to failure while in view of the expanding use of electric-powered vehicles and other power systems presenting similar issues, compact, affordable, and reliable fuse monitoring systems and methods to detect and evaluate a plurality of real-time parameters the collectively contribute to fuse fatigue to assess fuse performance and predict or estimate a remaining service life of the fuse are desired.

Providing less expensive fuse monitoring systems that are configured to handle high current and high battery voltages in state of the art EV power systems, while still providing acceptable interruption performance as the fuse element operates at high voltages and monitoring of at least the fuse element continues to be challenging. Fuse manufacturers and EV manufactures would each benefit from less expensive and less complex fuse monitoring systems. While EV innovations are leading the markets desired for smaller, more affordable higher voltage fuses and monitoring systems, the trend toward smaller, yet more powerful, electrical systems transcends the EV market. A variety of other power system applications would undoubtedly benefit from less complex and more affordable fuse monitoring systems. The demands imposed on electrical fuses by EV power system applications, however, presents particular challenges that may shorten a service life of the electrical fuses and that may result in unplanned downtime of the vehicle without additional monitoring systems to facilitate prediction of these failure events. Improvements are needed to resolve long-standing and unfulfilled needs in the art.

Inventive systems and methods are disclosed below wherein fuse monitoring is achieved at least in part by monitoring parameters such as environmental conditions/data/parameters and/or electrical performance parameters/operational parameters or data, and collectively evaluating the parameters for a similar fuse element to assess an operative state of the fuse, a performance of the fuse, and a remaining service life of the fuse. The environmental conditions or parameters may include ambient temperature, humidity, and/or pressure to which the fuse is exposed. The environmental conditions may also include vibration, acceleration, and/or shock to which the fuse is exposed. As used herein, "shock" may refer to impact force, as well as sudden change in acceleration or velocity. The electrical performance parameters include voltage, current, resistance, and/or temperature of the fuse attributable to current loads.

For the purposes of this description, the term "service life" is made in reference to the useful circuit protection life of the fuse, when in use as part of an electrical power system—i.e., the period of time in which the fuse functions as designed in protecting against overcurrent and/or short circuit conditions. Service life may be characterized in terms of remaining life/lifetime, remaining useful life/lifetime, consumed life/lifetime, consumed useful service life/lifetime, or simply as life expectancy, or life/lifetime until fuse replacement is recommended or required due to predicted end of life concerns in the power system that is being protected. As such, an appropriate life/lifetime warning or alert can be provided to an owner/driver of an EV, for example, as the predicted end of life approaches but in advance of actual fuse failure to proactively manage replacement of the fuse and avoid undesirable operation of the fuse while the EV is in use.

Described below are exemplary embodiments of systems and methods that facilitate a computationally-efficient and cost effective monitoring performance and estimation of a service life of an electrical fuse element. Monitoring of the performance of the fuse and advanced knowledge of the remaining service life of the fuse enables an operator to replace a fatigued fuse prior to failure and/or manage inventory of new fuse elements. Predicted fuse service life, as explained in detail below, will be achieved, at least in part, by measuring real-time parameters associated with the fuse (e.g., temperature, humidity, vibrations, shock, current, voltage, etc.) and applying a model to the measured real-time parameters to predict the remaining service life of the fuse. In some embodiments, the system may provide alerts and notifications concerning the measured parameters, the performance of the fuse and/or the predicted service life of the fuse to a user or an operator associated with the fuse. For example, the system communicates the measured parameters, fuse performance, and/or the remaining service life to one or more remote computing devices. Method aspects will be in part apparent and in part explicitly discussed in the following description.

In some embodiments, the systems and methods described herein may be used to determine if the fuse is functioning or if the fuse has failed. If the fuse has failed, the systems and methods may be used to determine one or more reasons, or causes, that contributed to, or caused the failure of the fuse. For example, fuse failure may have been caused by short-circuiting, overloading, and/or the fuse has faulted. In other examples, the fuse may have failed because the fuse was exposed to conditions, e.g., environmental conditions, that are not suitable for the ratings of the fuse. In yet another example, the fuse may have failed because an incorrect fuse was installed.

In some embodiments, the systems and methods described herein may be used to determine one or more recommendations. The recommendations may include maintenance operations, intervention procedures, and/or inventory analysis. Maintenance operations may include replacement of failed fuses or replacement of fuses prior to failure. Intervention procedures may include adjusting the conditions to which the fuse is exposed. For example, it may be recommended to cool an area near the fuse, or alternatively, turn off one or more electrical components in electrical connection with the fuse. In EV applications, it may be recommended to turn off the EV until safer fuse conditions can be obtained in order to avoid sudden fuse failure. Inventory management may include confirming that fuses are in stock, to be ready to replace one or more fuses that are predicted to fail in the near future. In addition, inventory management may include ordering one or more new fuses and/or shipping fuses from one storage facility to another. The one or more recommendations encompass any suitable recommendations that enables an optimized continued fuse usage while minimal downtime causes by fuse failure.

While the present disclosure describes systems, methods, and apparatus for monitoring fuses used in EV applications and embodiments of the present disclosure are described in the context of a particular type and rating of a fuse to meet the needs of the exemplary EV application, the benefits of the disclosure are not necessarily limited to EV applications or to the particular type or rating of fuses described. Rather the benefits of the disclosure are believed to more broadly accrue to many different power system applications generating other current profiles. Systems and methods described herein may also be used in other electric-powered vehicles such as boats or planes or non-vehicle power systems that are likewise susceptible to shock, vibration, and humidity. The systems and methods can also be practiced in part or in whole to monitor any types of fuses used for any application and in any environment having similar or different ratings than those discussed herein. For example, and without limitation, the fuse monitoring systems and methods described herein may be used to monitor fuses that are used in aerospace applications, automotive applications, and water related vehicles, e.g., submarines, boats, and other types of watercrafts. The fuses described below are therefore discussed for the sake of illustration rather than limitation.

Figure 2:
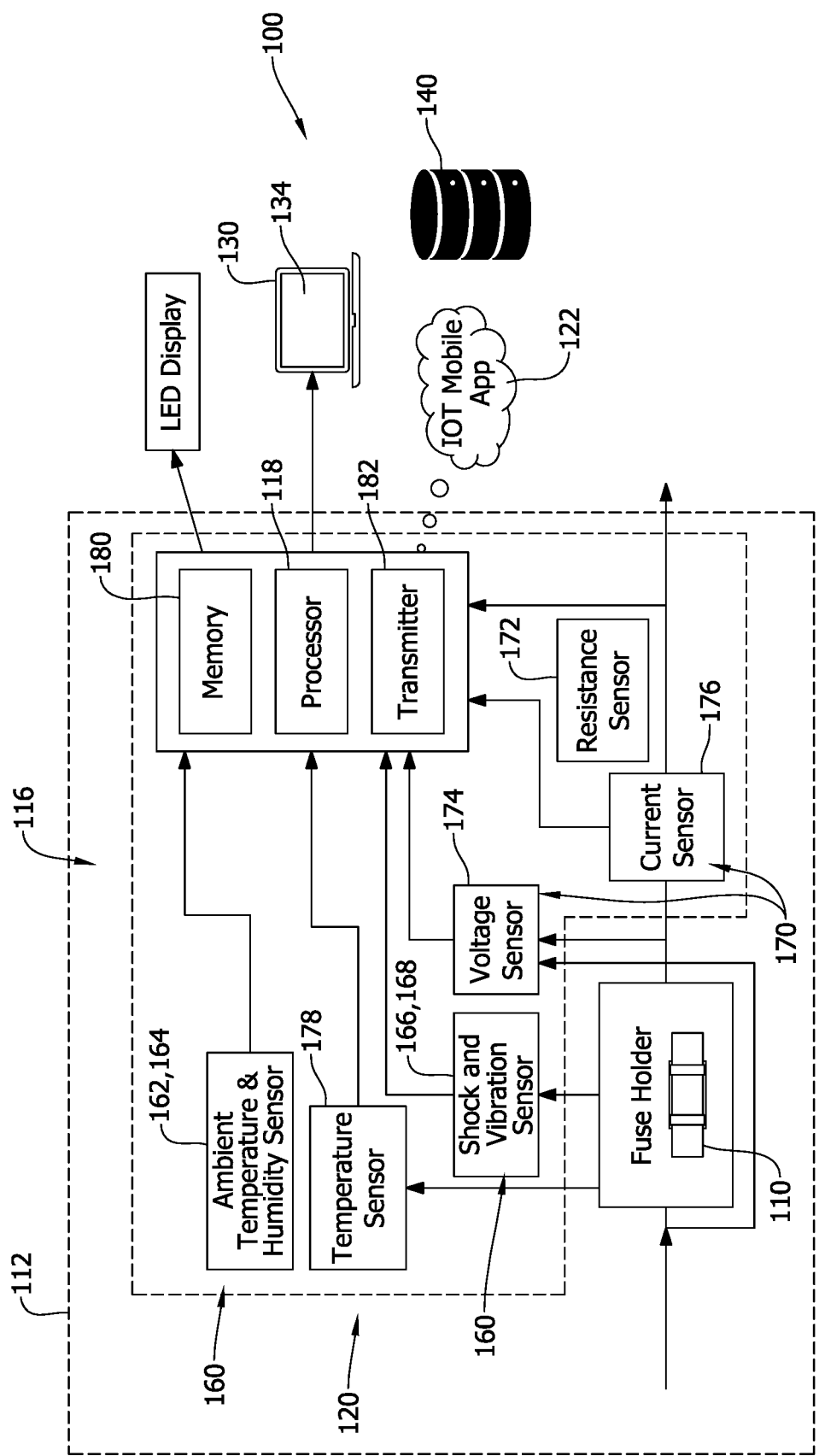
FIG. 2 is a block diagram of an exemplary fuse monitoring assembly for use with the fuse monitoring system shown in FIG. 1.

FIG. 1 is a schematic diagram of a fuse monitoring system 100 (referred to herein as system 100) for monitoring a fuse 110 according to the exemplary embodiments of the present disclosure. FIG. 2 is a block diagram of the system 100 shown in FIG. 1. In the illustrated embodiment, the fuse 110 is shown to be used with an EV 112. The fuse 110 and the EV 112 is illustrative only, and does not limit the scope of the system 100 to a particular type of fuse or particular EV configuration (e.g., car, crossover, sport utility vehicle, truck, etc.). As described in further detail herein, the system 100 includes one or more adjustable features that enable the system 100 to be customized to monitor various types of fuses (e.g., cartridge type fuse, D-type fuse, and link-type, etc.) used in various applications (e.g., transformers, motors, commercial settings, industrial settings, and computer applications, etc.).

The system 100 includes a fuse monitoring assembly 116 (referred to herein as assembly 116) which is positioned in proximity to the fuse 110. The assembly 116 includes a processor 118 that is communicatively coupled to one or more sensors 120. The one or more sensors 120 measure, in real-time, one or more parameters associated with the fuse 110. In the exemplary embodiment, the one or more measured parameters, measured by the sensors 120, include environmental conditions (e.g., ambient temperature, humidity, and/or pressure) and/or fuse performance parameters (e.g. fuse temperature, current, voltage, and/or resistance) associated with the fuse 110, as described in further detail herein. While one fuse 110 and one monitoring assembly 116 are shown in FIG. 1, it is understood that the system 100 is scalable to any number of fuses that are desirably monitored in the EV power system by adding additional monitoring assemblies 116.

The system 100 further includes a fuse monitoring computing device 130 that is communicatively coupled to the assembly 116. In the exemplary embodiment, the sensors 120 collect sensor data 132 related to the one or more measured parameters associated with the fuse 110 and the assembly 116 transmits the sensor data 132 to the computing device 130. The computing device 130 analyzes, processes, and/or evaluates the sensor data 132 for the purpose of monitoring the fuse 110. The computing device 130 may include a user interface 134 for displaying sensor data 132 and/or analyzed sensor data 132. The user interface 152 may include a graphical interface with interactive functionality, such that a user or an operator may interactively request information from the system 100. In some embodiments, the computing device 130 is connected to the assembly 116, e.g., the processor 118, via a USB connection. For example, the processor 118 may evaluate the sensor data to create one or more outputs to be displayed on the computing device 130, e.g., via the user interface 134. The computing device 130 may be connected to the processor 118 and/or the sensors 120 using any suitable connection. In some embodiments, the user computing device 150 may be connected to the processor 118 and/or the sensors 120 using the USB connection.

In the exemplary embodiment, the computing device 130 evaluates the sensor data 132 using modeling techniques, as described in further detail herein, to determine the remaining fuse service life. In some embodiments, the computing device 130 compares the sensor data 132 to one or more corresponding predetermined threshold values to evaluate the performance of the fuse 110. In some embodiments, the computing device 130 may determine, based at least in part on the sensor data 132, one or more fuse metrics. The fuse metrics may include an average of the sensor data 132 over a period of time and/or a rate of change of the sensor data 132 over a period of time. In another embodiment, the computing device 130 filters and/or normalizes the sensor data 132. The computing device 130 may evaluate the sensor data 132 using any suitable methodology or technique that enables the system 100 to function as described herein.

The system 100 also includes a historical fuse database 140. The computing device 130 is communicatively coupled to the historical fuse database 140 and stores in the historical fuse database 140 a plurality of historical fuse records 142. The historical fuse records 142 are each associated with a historical fuse, i.e., a fuse that has been retired, replaced, and/or has failed. Each of the historical fuse records 142 may include a fuse type, a fuse application (i.e., the use of the historical fuse, e.g., an EV application, or an industrial application, etc.), a historical fuse service life, and/or historical measured fuse parameters. Historical measured fuse parameters may include historical shock data, historical ambient temperature data, historical ambient humidity data, historical vibrations data, historical current data, historical voltage data, historical fuse temperature data, and/or historical resistance data. The historical fuse records 142 may also include one or more metrics determined by the computing device 130. For example, the computing device 130 may determine a historical average and/or rate of change of one or more of the historical measured fuse parameters to be included within the historical fuse record 142. The historical fuse service life may include an amount of time that the fuse 110 was in use prior to fuse failure. The historical fuse service life may include a number of service cycles prior to fuse failure. The computing device 130 may create the historical fuse record 142 using any suitable data such that the system 100 is configured to function as described herein.

The computing device 130 may also store the sensor data 132 and/or the one or more determined metrics associated with the fuse 110 within the historical fuse database 140. In some embodiments, the assembly 116 is also communicatively coupled to the historical fuse database 140 such that the assembly 116 may transmit the sensor data 132 to be stored within the historical fuse database 140.

In the exemplary embodiment, the system 100 further includes a user computing device 150 that is communicatively coupled to the computing device 130. The user computing device 150 may include a mobile cellular device, a laptop computer, a desktop computer, a tablet computer, and the like. The user computing device 150 includes a user interface 152. The user interface 152 may include a graphical interface with interactive functionality, such that a user or an operator may interactively request information from the system 100. In some embodiments, the user computing device 150 is also communicatively coupled to the assembly 116. The user computing device 150 is associated with a computing device that is accessible to a user (e.g., an operator of the EV 112, a worker within an industrial environment, and/or any persons associated with the monitoring of the fuse 110) enabling the user to monitor the fuse 110 in real-time. Specifically, the computing device 130 transmits a plurality of messages 154 to the user computing device 150. The messages 154 include information related to the fuse 110. In the exemplary embodiment, the message 154 includes the determined remaining service life of the fuse 110. The messages 154 may also include the sensor data 132 (i.e., the measured fuse performance parameters or the measured environmental conditions). The message 154 may include a maintenance recommendation. The computing device 130 transmits any data and/or information that enables system 100 to function as described herein.

In the exemplary embodiment, the user computing device 150 may display at least a portion of the contents of the messages 154 using the user interface 152. In some embodiments, the user computing device 150 is associated with the EV 112. For example, the user computing device 150 may be integral to the EV 112 and communicatively coupled to a dashboard display (not shown) or integrated into an infotainment system of the vehicle. The dashboard display and/or infotainment display may be configured to present at least a portion of the contents of the messages 154 received from the computing device 130. Accordingly, real-time monitored fuse status such as measured parameters, calculated metrics, and predicted remaining fuse service life may be presented to a user who is operating the EV 112 or to passengers through vehicle systems.

In the exemplary embodiment, the computing device 130 transmits the messages 154 to the user computing device 150 as frequently as necessary to enable the system 100 to function as described herein. In other words, the computing device 130 transmits messages 154 with sufficient frequency to ensure the user computing device 150 is kept up to date with the real-time status of the fuse(s) being monitored (e.g., performance and/or remaining service life of the fuse(s) 110). The computing device 130 may transmit messages 154 periodically at scheduled time intervals. The computing device 130 may also transmit the messages 154 in response to the computing device 130 processing, evaluating, and/or analyzing the sensor data 132. For example, the computing device 130 may periodically determine the remaining service life, and then may compare the determined remaining service life to a service life threshold. When the computing device 130 determines that the determined remaining service life passes the service life threshold, the computing device 130 may transmit the message 154 to the user computing device 150, the message 154 including a warning that the determined remaining service life is below the service life threshold.

In the exemplary embodiment, the assembly 116, the computing device 130, and the user computing device 150 are connected as an Internet of Things (IoT) 122, where the assembly 116 includes sensors and processors and communicates with the computing device 130 and/or the user computing device 150 through Internet or other communication networks formed by wired or wireless communication. The assembly 116, the computing device 130, and the user computing device 150 may communicate with any other device that is also connected to the IoT 122. The one or more sensors 120 may also be wirelessly communicatively coupled to the processor 118, such that the one or more sensors 120 may transmit sensor data 132 to the processor 118 wirelessly. In other embodiments, the one or more sensors 120 may transmit sensor data 132 to the processor 118 through a wired connection. The computing device 130, the assembly 116, and the user computing device 150 may be connected to the IoT 122 through a wired or a wireless connection, supervisory control and data acquisition (SCADA), or any monitoring or control device. Alternatively, the fuse monitoring assembly 116 may communicate with the computing device 130 directly through radio frequency (RF) communication such as short-wave RF communication. Accordingly, data (e.g., sensor data 132 or analyzed/processed sensor data 132) may be wirelessly transmitted from the sensors 120 to the processor 118 or from the assembly 116 to the computing device 130. Furthermore, data may be wirelessly transmitted from the computing device 130 to the user computing device 150.

The system 100 configured as IoT 122 is advantageous in saving labor cost and reducing lead time. For example, with the system 100, inspection or maintenance may be reduced because the operation status and life of the assembly 116 is available through the computing device 130 and/or the user computing device 150. Further, lead time, the time needed to locate faulty fuses, is reduced because the system 100 provides information of and alerts faulty fuses, and also predicts the end of lives the fuses such that failure of the fuses may be soon expected.

The assembly 116, the computing device 130, and the user computer device 150 are separate but are communicatively connected enabling the assembly 116, the computing device 130, and the user computing device 150 to exchange information. However, it should be understood that the computing device 130, the user computing device 150, and the assembly 116 may be integrated into a single computing device with all the functionality of each of the computing device 130, the user computing device 150, and the assembly 116, separately, without deviating from the substantially from the present disclosure.

In the exemplary embodiment, at least one of the fuse monitoring assembly 116, the computing device 130, and the at least one sensor communicates with a mobile tower, a cell tower, or a base transceiver station (BTS). The BTS includes antennas and electronic communication equipment, and create a cell in a cellular network or a telecommunications network, which is used for transmission of voice, data, and other types of content. The BTS may be in a telecommunications network such as 3G, 4G, or 5G networks In some embodiments, the computing device 130 includes a processor-based microcontroller including a processor and a memory device wherein executable instructions, commands, and control algorithms, as well as other data and information needed to satisfactorily operate the fuse monitoring system 100, are stored. The memory device may be, for example, a random access memory (RAM), and other forms of memory used in conjunction with RAM memory, including but not limited to flash memory (FLASH), programmable read only memory (PROM), and electronically erasable programmable read only memory (EEPROM).

As used herein, the term "processor-based" microcontroller shall refer not only to controller devices including a processor or microprocessor as shown, but also to other equivalent elements such as microcomputers, programmable logic controllers, reduced instruction set circuits (RISC), application specific integrated circuits and other programmable circuits, logic circuits, equivalents thereof, and any other circuit or processor capable of executing the functions described below. The processor-based devices listed above are exemplary only, and are thus not intended to limit in any way the definition and/or meaning of the term "processor-based."

In further reference to FIG. 2, the assembly 116, for use within the EV 112, includes any number of sensors 120 enabling the system 100 to function as described herein. In the exemplary embodiment, the one or more sensors 120 includes environmental sensors 160 that are configured to measure the environmental conditions of the environment in which the fuse 110 locates, e.g., ambient temperature, ambient humidity, ambient pressure, vibrations, and shock. In the exemplary embodiment, the assembly 116 includes an ambient temperature sensor 162 configured to measure the temperature in proximity to the fuse 110 and an ambient humidity sensor 164 configured to measure the humidity in proximity to the fuse 110. In some embodiments, the one or more sensors may also include an ambient pressure sensor. In the exemplary embodiment, the assembly 116 also includes a vibration sensor 166 configured to measure vibration and a force sensor 168 configured to measure shock to which the fuse 110 may be exposed. The vibration sensor 166 is an inertial sensor or an accelerometer which detects accelerations and/or vibrations of the fuse 110. In some embodiments, the vibration sensor 166 is used to detect and measure shock and/or impact experienced by the fuse 110. The force sensor 168 may include a load cell, a strain gauge, and/or a resistor.

The environmental sensors 160 which are configured to measure environmental conditions may be selectively positionable relative to the fuse 110, such that the environmental sensors 160 may be arranged in sufficient proximity to the fuse 110 so that the environmental sensors 160 measure environmental conditions to which the fuse 110 is exposed. Positioned in proximity refers to a relative spatial position between the fuse 110 and the one or more sensors 120. In some embodiments, the environmental sensors 160 may be mounted within 30 cm of the fuse 110 (i.e., within a range of 0 cm to 30 cm from the actual fuse location), for example. In other example embodiments, the environmental sensors 160 may be mounted within 15 cm of the fuse 110 (i.e., within a range of 0 cm to 15 cm from the actual fuse location). In other embodiments, the environmental sensors 160 are positioned in sufficient proximity to the fuse 110 to enable the one or more environmental sensors 160 to measure the environmental conditions to which the fuse 110 is exposed.

In the exemplary embodiment, the one or more sensors 120 includes electrical sensors 170 that are configured to measure fuse performance parameters associated with the fuse 110 e.g., fuse temperature, resistance (e.g., resistance across the fuse), input current, output current, and/or voltage across the fuse 110. The fuse temperature and the environmental temperature may be correlated but are two separate measurements. The environmental, also referred to as ambient, temperature is the temperature to which the fuse 110 is exposed, while the fuse temperature is the operating temperature of the fuse 110, itself, which may be heated by both the environmental temperature and joule heating attributable to current flowing through the fuse 110. In the exemplary embodiment, the system 100 includes resistance sensor 172 configured to measure resistance, a voltage sensor 174 configured to measure voltage across the fuse, a current sensor 176 configured to measure at least one of input and output current of the fuse 110, and fuse temperature sensor 178 configured to measure fuse temperature. Determining resistance using the resistance sensor 172 may include determining the resistance using sensor data 132 collected from the voltage sensor 174 and/or the current sensor 176. The temperature, current, voltage, and resistance sensors 172, 174, 176, and 178 are each operably coupled to the fuse 110 for direct measurement of the fuse performance parameters. In some embodiments, a resistance sensor is not included, and the resistance is calculated using data collected from the voltage sensor 174 and/or the current sensor 176 using the formula that Resistance is equal to Voltage divided by Current.

As described above, the processor 118, of the assembly 116, is communicatively coupled to each of the one or more sensors 120. In some embodiments, the assembly 116 may include an assembly memory 180 that is communicatively coupled to the processor 118 and/or the one or more sensors 120. The processor 118 may collect the sensor data 132 and store the sensor data 132 within the assembly memory 180, prior to transmitting the sensor data 132 to the computing device. In the exemplary embodiment, the assembly 116 may include an assembly transmitter 182 that the processor 118 uses to transmit the sensor data 132, in-real time, to the computing device 130. The sensor data 132 may be periodically or continuously transmitted to the computing device 130. The processor 118 may transmit the sensor data 132 at a rate that is approximately equal to a sampling rate of the one or more sensors 120. For example, the ambient temperature sensor 162 may sample ambient temperature every second, for example, and accordingly, the processor 118 transmits the sensor data 132 to the computing device 130 every second. In some embodiments, the processor 118 may store the sensor data 132 within the assembly memory 180 and then periodically, at scheduled time increments, transmit the sensor data 132 to the computing device 130 in batches.

In some embodiments, the processor 118 may compare the sensor data 132 to one or more corresponding predetermined thresholds. When the processor 118 determines that the sensor data 132 has exceeded the predetermined threshold, the processor 118 may initiate transmission of the sensor data 132, and/or a warning message, to the computing device 130. When the processor 118 determines that one or more thresholds have been crossed, the processor 118 may override a scheduled periodic transmission of the sensor data 132. The processor 118 may transmit the sensor data 132 to the computing device 130 as frequently as necessary to enable the system 100 to function as described herein.

In the exemplary embodiment, the computing device 130 builds a training dataset by retrieving a set of historical fuse records 142 (e.g., hundreds, thousands, tens of thousands, hundreds of thousands, etc. of historical fuse records 142) from the historical fuse database 140. Each of the historical fuse records includes a fuse type, a fuse application, a fuse service life, historical fuse data collected by the one or more sensors 120. In some example embodiments, the historical fuse records may include one or more metrics that are calculated by the computing device. For example, the computing device may calculate a historical average temperature, humidity, and/or pressure, to be included within the historical fuse record. The fuse service life may include an amount of time that the fuse was in use before the fuse failed.

The training dataset may be used to train a fuse model. In some embodiments, the computing device 130 builds fuse specific training datasets which include a plurality of historical fuse records each associated with a specific type of fuse or a specific type of fuse application. For example, the computing device 130 may build a EV training dataset which includes a plurality of historical fuse records 142 associated with a plurality of fuses that were used in EV applications. In yet another embodiment, the computing device 130 may build an industrial training dataset which includes a plurality of historical fuse records 142 associated with a plurality of fuses that were used in an industrial environment. In yet another example, the computing device 130 may build a global training dataset which includes a plurality of historical fuse records 142 associated with a plurality of fuses that were used for various applications.

The computing device 130 generates a fuse model based on the one or more training datasets using machine learning techniques. More specifically, the computing device 130 uses the training dataset to train the fuse model, such as to develop a set of rules or conditions that may be applied to real-time sensor data 132, i.e., inputs, and generate outputs associated with the fuse.

In the example embodiment, the computing device 130 includes a modeling component. The modeling component includes a computer-executable instruction for using at least a machine learning algorithm. Some machine learning algorithms used by the modeling component include artificial neural network and Bayesian statistics. Other machine learning models used by the modeling component may include, for example, decision tree, inductive logic, learning vector quantization, ordinal classification, and information fuzzy networks (IFN).

As used herein, "machine learning" refers to statistical techniques to give computer system the ability to "learn" (e.g., progressively improve performance on a specific task) with data, without being explicitly programmed for that specific task. "Artificial intelligence" refers to computer-executed techniques that allow a computer to interpret external data, "learn" from that data, and apply that knowledge to a particular end. Artificial intelligence may include, for example, neural networks used for predicative modeling.

The computing device 130 applies one or more inputs into the model to determine or more outputs. In the exemplary embodiment, the one or more inputs are fuse data associated with the fuse 110, such as the sensor data 132, collected in real-time, by the plurality of sensors 120. Fuse data include operational data such as current, voltage, resistance, and/or temperature of the fuse 110 and environmental data associated with the fuse 110 such as shock, vibration, ambient temperature, and/or humidity of the environment in which the fuse 110 locates. Inputs may also include other fuse data associated with the fuse 110, such as fuse class, fuse maximum current rating, interrupting rating, current limiting, and a general use of the fuse. Fuse data may also include if the fuse 110 is fast acting or time-delayed. In some embodiments, the computing device 130 may calculate inputs, based at least in part on sensor data 132, to be applied to model. For example, the computing device 130 may calculate an average ambient temperature over a period of time. The computing device 130 may use the average ambient temperature as an input into the model.

The sensor data 132 may be received by the computing device 130, in real-time, e.g., continuously and/or periodically, and the computing device 130 may apply the model to the sensor data 132, continuously (e.g., at a sampling rate of the plurality of sensors 120) and/or periodically, such that the output of the model reflects the real-time state of the fuse. For example, the computing device 130 may receive from the processor 118, real-time ambient temperature data, collected by the ambient temperature sensor 162. The computing device 130 may input the real-time ambient temperature data into the model periodically at scheduled time intervals, e.g., every minute, every five minutes, every hour, every three hours, for example, to determine the remaining service life of the fuse 110.

The computing device 130 may apply the inputs to the model to determine one or more outputs. In the exemplary embodiment, the one or more outputs may include a remaining service life of the fuse associated with how long the fuse should be used before the fuse should be replaced or before the fuse will fail. The remaining service life of the fuse may be a remaining service life time (e.g., ten hours remaining service life), a number of remaining service life cycles (e.g., the fuse may be used ten more times before replacement is recommended). In some embodiments, the output may include a suggested fuse classification. For example, the computing device 130 may determine, using the model and the inputs, for a fuse having a first classification and used in a specific application, that a different fuse classification may be better suited for the application. In some embodiments, the output may include a determination of whether the fuse 110 is no longer functioning, e.g., the fuse 110 has failed. For example, the output may include a determination that the fuse 110 has short-circuited, overload, and/or has faulted. In other examples, the output may include a determination that the fuse 110 is not suitable for a particular application, e.g., a fuse was incorrectly installed or a wrong type of fuse was installed.

In some embodiments, a physical model is used to predict life of a fuse based on environmental data and/or operation data. For example, a physical model may include empirical relations between fuse data and life of the fuse derived based on historical data, physical relations, or rules such as Miner's rule based on the cyclic characteristics of the operational data such as current, voltage, and/or resistance. The historical data may be used to fit and optimize the model. In one example, a plurality of thresholds on environmental data and/or operation data may be derived based on historical data and used to predict the life of the fuse. Alternatively, a combination of a physics model and a machine-learning model is used to predict life of a fuse based on the measured data. For example, the prediction may be started with a physical model when training or historical data is lacking or insufficient to train a machine-learning model to achieve a desired confidence level. The real-time data and predicted life may be used to train the machine-learning model. As the confidence level of the machine-learning model increases, the machine-learning model may become the main model in life prediction.

Systems and methods described herein predict the remaining life based on operation data such as resistance, current, voltage, and/or temperature of the fuse, as well as environmental data such as ambient temperature, shock, vibration, and/or humidity of the ambient environment of the fuse. The accuracy of the predicted life is increased because environmental data and operation data both play a role in affecting the fuse's life.

Figure 3:
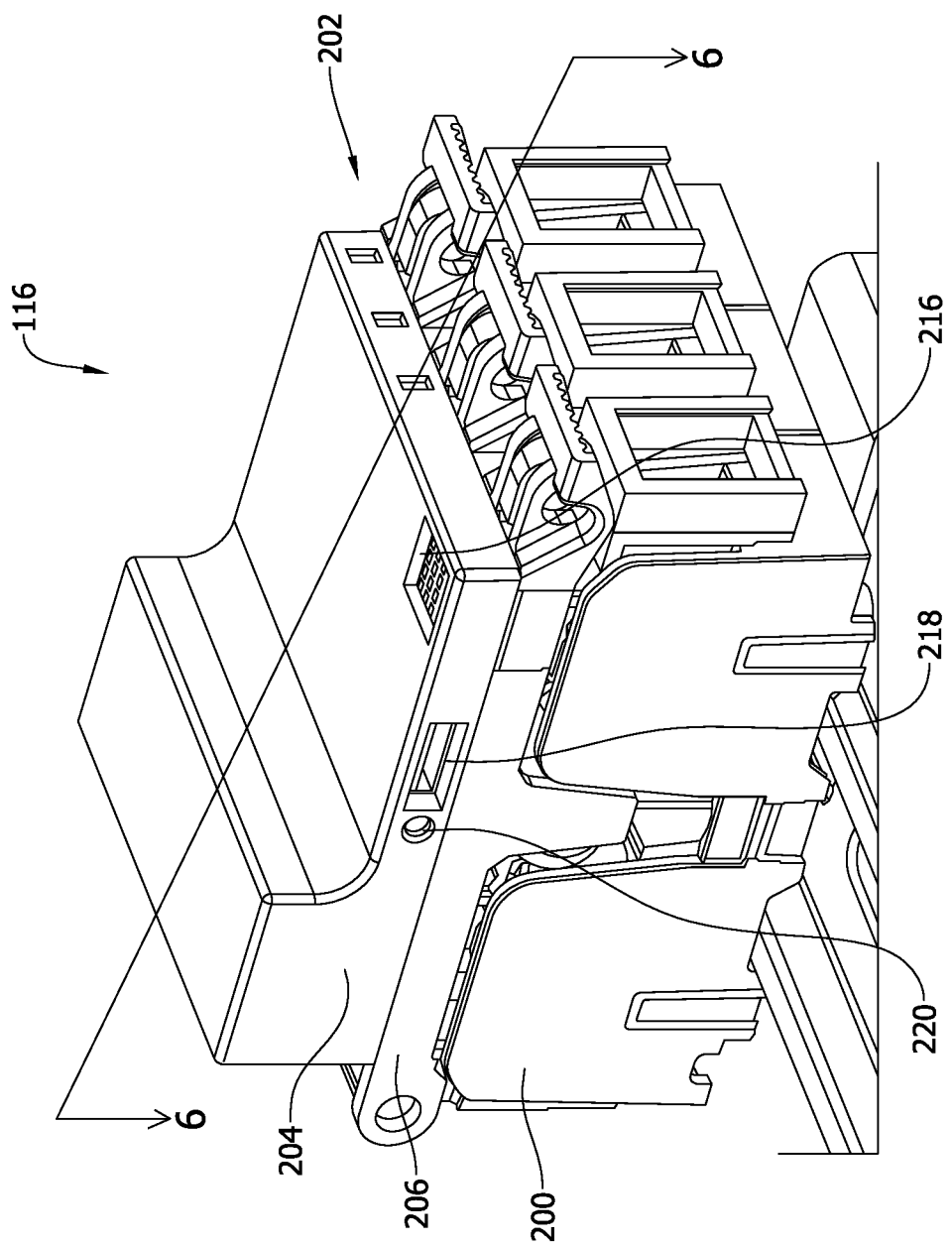
FIG. 3 is a perspective view of an exemplary embodiment of the fuse monitoring assembly for use with the fuse monitoring system shown in FIG. 1, wherein the fuse monitoring assembly is shown to be coupled to a fuse housing.

FIG. 3 is a perspective view of an exemplary embodiment of the fuse monitoring assembly 116. The fuse monitoring assembly 116 illustrated in FIG. 3 is shown to be connected to a fuse housing 200 which supports one or more fuses 110 (visible in FIGS. 5 and 6) that are monitored by the assembly 116. In reference to FIG. 4, the assembly 116 includes a housing 202 having an upper housing 204 and a lower housing 206. The upper housing 204 and the lower housing 206 may be selectively coupled together, using any suitable fasteners or fastening techniques, to define a housing cavity 208. The upper housing 204 and lower housing 206 may be selectively coupled together such that a user may separate the upper housing 204 from the lower housing 206 to access the contents of the housing cavity 208, as is described in further detail herein. In some embodiments, the upper housing 204 and the lower housing 206 are rotationally connected. In reference to FIG. 4, in this illustrated embodiment, the assembly 116 is configured to monitor three fuses 110. In other embodiments, the fuse monitoring assembly 116 may be configured to monitor any number of fuses 110, including a single fuse (i.e., one and only one fuse) as desired.

As described above, the assembly 116 is customizable and modular such that the assembly 116 is configured to monitor various types of fuses used in various applications without changing the design of the assembly 116. For example, in the illustrated embodiment, the housing 202 may be sized and shaped such that the assembly 116 is suitable to be selectively coupled to a fuse housing 200 having any shape or size. In the illustrated embodiment, the housing 202 includes one or more clips 210 that are sized and shaped to be received within an opening 212 formed on the fuse housing 200. The clips 210 include a bias mechanism enabling the clips 210 to be frictionally engaged with the fuse housing 200 when the clips 210 are disposed within the openings 212 (see FIG. 6), such that the housing 202 is selectively coupled to the fuse housing 200. In other embodiments, housing 202 may be selectively connected to the fuse housing 200 using any suitable fasteners. In some embodiments, the assembly 116 is configured to be retrofitted to existing fuse housings 200. For example, the fuse monitoring assembly 116 may include any number of sensors 120 such that the assembly 116 is configured to monitor any number of the fuses 110 contained within the fuse housing 200.

Furthermore, different applications the fuse 110 may be exposed to different conditions, as such the assembly 116 may be customizable such that the assembly 116 may be configured to monitor a specific type of fuse having a specific fuse classifications and/or a specific fuse application. In the illustrated embodiment, the assembly 116 is customized to monitor the fuse 110 used in the EV 112. In an alternative embodiment, the assembly 116 may be customized to monitor a fuse used in an industrial application. The assembly 116 may also be customized to monitor a specific classification of fuse. For example, the assembly 116 may include sensors 120 that are rated to measure a range of current, voltage, and/or resistance that the fuse 110 is likely to experience. A modular assembly 116 allows reduction of costs and simplification of maintenance and updates. For example, if a fuse has already been installed on site, the modular assembly 116 is configured to monitor the fuse 110 without the need to replace the fuse and the fuse housing 200.

Figure 4:
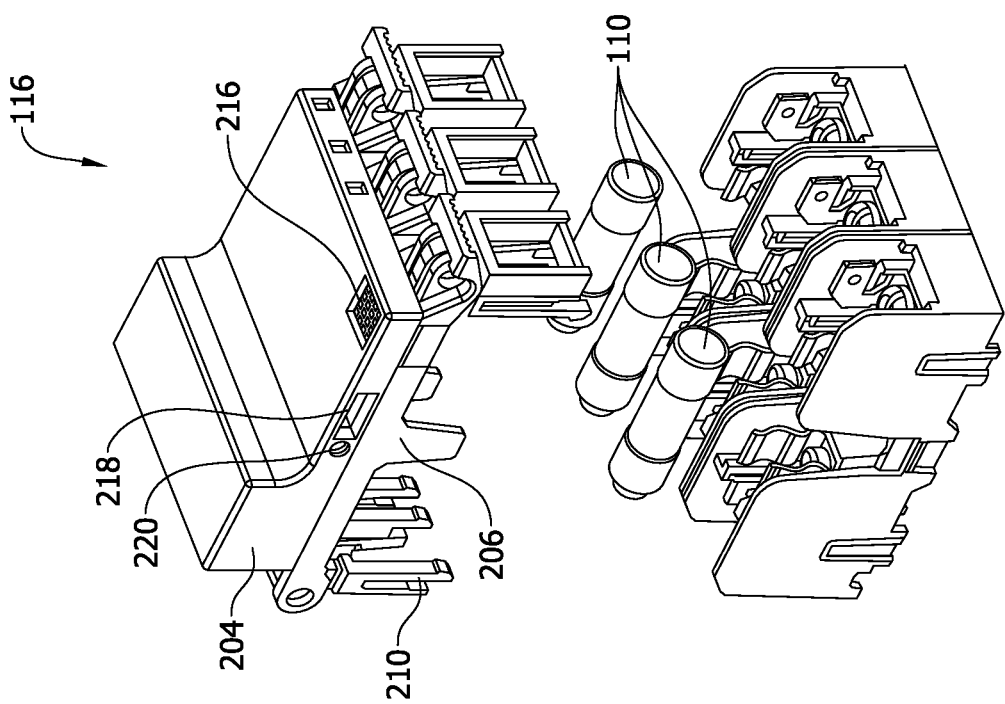
FIG. 4 is a partially exploded assembly view of the fuse monitoring assembly, one or more fuses, and the fuse housing.
Figure 5:
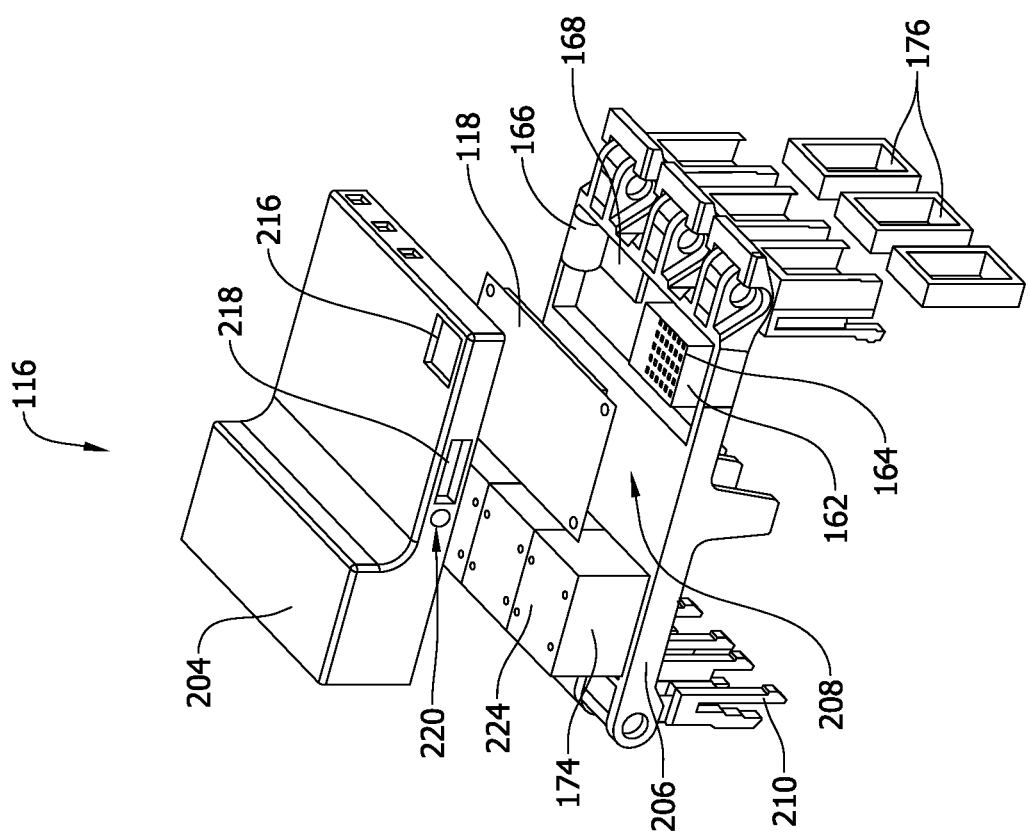
FIG. 5 is an exploded view of a portion the fuse monitoring assembly shown in FIG. 3.

In further reference to FIG. 4, the housing cavity 208 stores therein the processor 118, and the plurality of sensors 120. The processor 118 and the plurality of sensors 120 may be connected to at least one of the upper housing 204 and/or the lower housing 206. The housing 202 is selectively coupled to the fuse housing 200 such that the plurality of sensors 120 are arranged in proximity to the fuse 110. In the illustrated embodiment, the assembly 116 includes both the environmental sensors 160 and the fuse performance electrical sensors 170. In particular, in the exemplary embodiment, the assembly 116 includes the ambient temperature sensor 162, the humidity sensor 164, the vibration sensor 166, and the force sensor 168. The assembly 116 also includes the voltage sensor 174 and the current sensor 176. The housing 202 includes an opening 216 in proximity to the ambient temperature sensor 162 and the humidity sensor 164. The opening allows the ambient temperature sensor 162 and the humidity sensor 164 to be exposed to the environmental conditions outside of the housing 202. In some other embodiments, the ambient temperature sensor 162 and the humidity sensor 164 may be coupled to the exterior of the housing 202. The contents stored within the housing cavity 208, i.e., the processor 118 and the plurality of sensors 120, are accessible without requiring the assembly 116 to be disconnected from the fuse 110 and/or the fuse housing 200. More specifically, the assembly 116 may be connected to one or more fuses 110 and/or the fuse housing 200, and subsequently, an operator may access the contents of the housing cavity 208 by opening the housing 202. The housing 202 may be opened by decoupling or disengaging the upper housing 204 from the lower housing 206. Alternatively, the housing 202 may be opened by disconnecting a portion of the upper housing 204 from the lower housing 206 and then rotating the upper housing 204 relative to lower housing 206. Opening of the housing 202 provides an operator with a readily access to the contents stored within the housing cavity 208, without requiring the operator to disengage the housing 202, in its entirety, from the fuse 110 or the fuse housing 200. An operator may open the housing 202 to perform maintenance operations, such as, inspect, replace, or repair one or more of the contents within the housing cavity 208. For example and without limitation, an operator may open the housing 202 to replace the ambient temperature sensor 162. Opening of the housing 202 allows a maintenance procedure to be performed without disruption of the fuses 110.

The fuses 110, being monitored by the assembly 116, are accessible by the removal of the lower housing 206 from the fuses 110 and/or the fuse housing 200. In the exemplary embodiment, the fuses 110 are accessible without requiring opening of the housing 202. Stated another way, an operator may readily access the fuses 110 that are being monitored by disconnecting the lower housing 206, without requiring the operator to open the housing 202. Removal of the housing 202, to access the fuses 110 without opening the housing 202, reduces exposure of the contents of the housing cavity 208 from potential harmful conditions, e.g., exposure of the one or more sensors 120 stored within the housing cavity 208, to debris or liquids. Furthermore, the assembly 116 may be disconnected from the fuse 110 and/or fuse housing 200 for replacement and/or repair of the assembly 116, for example for an upgrade (e.g., software upgrade). In yet another example, the assembly 116 may be replaced with an alternative assembly 116 having one or more of the plurality of sensor 120 rated for specific conditions and/or environmental conditions. For example, for the assembly 116 used in an EV 112 that typically travels in a climate in which has an annular mean temperature of 30°, for example, is now used in a climate in which the annular mean temperature is 10° C. Accordingly, the assembly 116 may be exchanged with another assembly 116 having an ambient temperature sensor that is rated for the climate of the location of the EV 112.

The housing 202 defines a first port 218 that is sized and shaped such that a cable (e.g., USB connection or any suitable connection, not shown) may be passed through the first port 218 to be operably coupled to the processor 118 contained within the housing 202. The housing 202 also includes a second port 220 that is sized and shaped such that a display cable may be passed through the second port 220 to be operably coupled to the processor 118 contained within the housing cavity 208. The housing 202 may include any suitable number and/or configuration of ports that allow access to one or more components stored within the housing cavity 208.

In the exemplary embodiment, the upper housing 204 and the lower housing 206 are sized and shaped such that the housing cavity 208 is a suitable sized and shaped to accommodate the dimensions of the plurality of sensors 120 stored therein, while maintaining a small and compact overall profile of the housing. For example, the upper housing 204 and the lower housing 206 are not oversized and the plurality of sensors 120 fit within the housing cavity 208 with a limited clearance C, visible in FIG. 6, between the plurality of sensors 120 and the upper housing 204 and the lower housing 206. The clearance C may be, for example, between 0-2.5 mm. In some embodiments, the clearance C is not uniform. In some embodiments, the sensors 120 are supported by or in contact with the lower housing 206 and the clearance C is defined between the sensors 120 and the upper housing 204.

Figure 6:
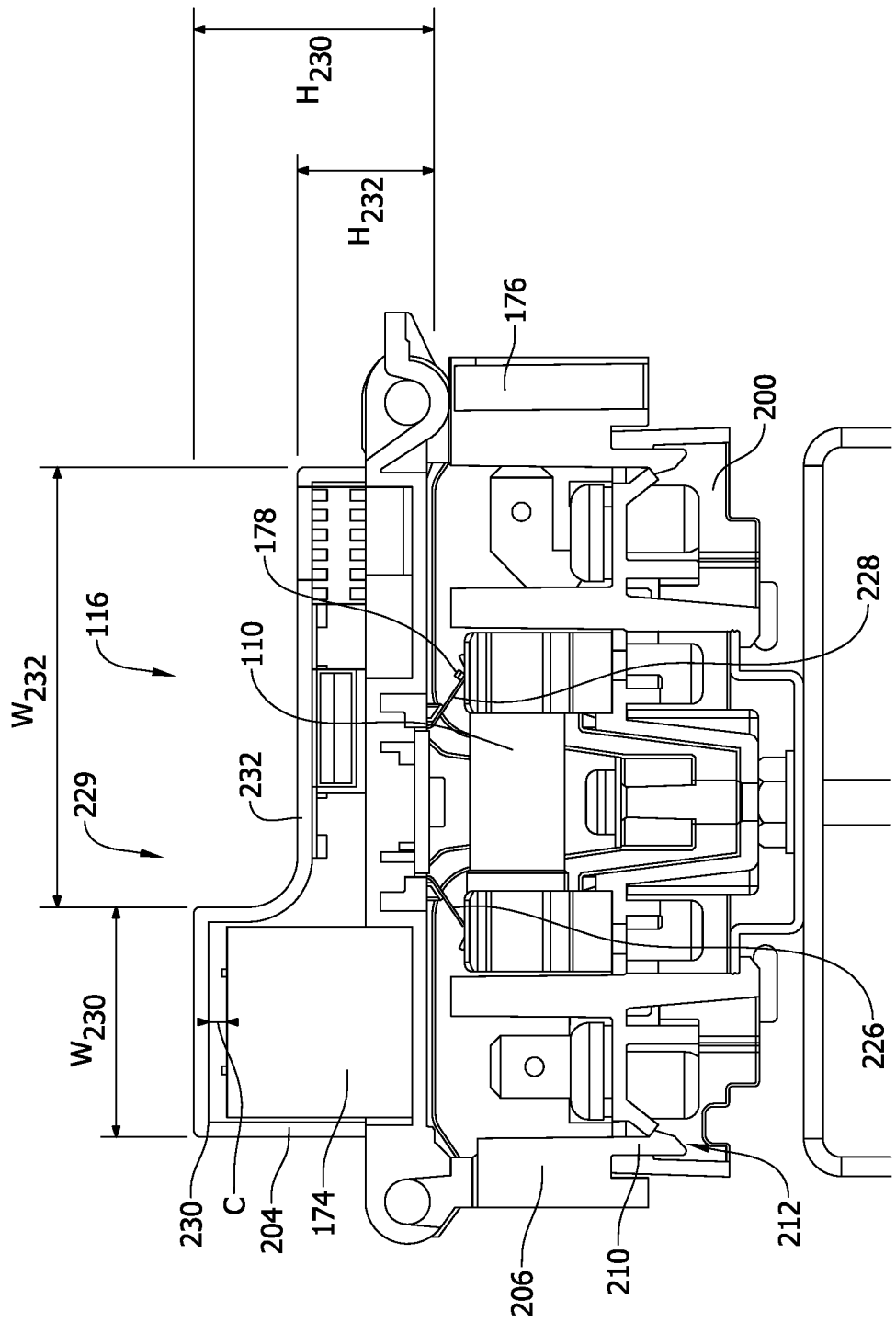
FIG. 6 is a cross-sectional view of the fuse monitoring assembly connected to the fuse housing shown in FIG. 3 along cross-sectional line 6-6 shown in FIG. 3.

In reference to FIG. 6, in the exemplary embodiment, the housing 202 has one or more portions 229. Each of the portions 229 are sized and shaped to accommodate the size and shape of the contents of the portion 229. In the exemplary embodiment, the upper housing 204 includes at least one of a first portion 230 and a second portion 232. The first portion 230 stores therein the plurality of voltage sensors 174. Accordingly, the first portion 230 has a first height $H_{230}$ and a first width $W_{230}$ that is suitable to accommodate the dimensions of the plurality of the voltage sensors 174 with minimal clearance between the voltage sensors 174 and the first portion 230. In other words, the first portion 230 is not oversized, but sized such that the voltage sensors 174 fit within the first portion 230. The second portion 232 stores therein at least one of the environmental sensors 160. The second portion 232 includes a second height $H_{232}$ and a second width $W_{232}$. The second height $H_{232}$ and the second width $W_{232}$ are sized to accommodate the dimensions of the environmental sensors 160 with minimal clearance between the environmental sensors 160 and the second portion 232. The second portion 232 may include the opening 216.

In the illustrated embodiment, at least one of the environmental sensors 160 generally has smaller dimensions than that of one of the voltage sensors 174. Accordingly, the height $H_{232}$ of the second portion 232 is smaller than the height $H_{230}$ of the first portion 230. Additionally, and/or alternatively, the number of voltage sensors 174 are proportional to the number of fuses 110 that are monitored by the assembly 116. As described above in the illustrated embodiment, there are three fuses 110 that are being monitored, and accordingly, there are three voltage sensors 174. On the other hand, there is only one of each environmental sensor 160 for all fuses 110. Accordingly, the first portion 230 and the second portion 232 are of different sizes, shapes, and/or profiles to accommodate both the number of the sensors 120 and the size of the sensors 120 that are stored therein.

In other embodiments, the housing 202 may have any number of portions 229 that are sized and shaped differently to accommodate the contents of the portion 229 with minimal clearance. Minimal clearance C between the contents of the assembly 116 and each of the portions 229 allows the assembly 116 to have a reduced overall size suitable for installation in the tight and generally compact conditions presented in the EV 112. In other embodiments, the portion 229 may have any suitable size and shape that enables the assembly 116 to function as described herein.

In some embodiments, the assembly memory 180 and the transmitter 182 are formed integrally with the processor 118. The assembly 116 may include any other suitable electronic components that enable the system 100 to function as described herein. For example, in the exemplary embodiment, the assembly 116 includes one or more voltage relays 224.

FIG. 6 is a cross-sectional view of the assembly 116 coupled to a fuse housing 200 for monitoring the fuse 110 stored therein. The cross-sectional view illustrates the connection of the voltage sensor 174 and the fuse temperature sensor 178 which is configured to monitor the temperature of the fuse 110. The voltage sensor 174 includes a first lead 226 and second lead 228. The first lead 226 and second lead 228 are operably coupled to a first and second terminal of the fuse 110, enabling the voltage sensor 174 to measure the voltage across the fuse 110. In other words, the voltage sensor 174 is operably coupled in parallel to the fuse 110 to detect the voltage across the fuse 110. The fuse temperature sensor 178 is coupled to the fuse 110, i.e., in contact with the fuse 110, and/or in sufficient proximity to the fuse 110. The lower housing 206 may include one or more openings, not shown, such that at least a portion of the voltage sensor 174 and the fuse temperature sensor 178 may extend out of the housing 202 in order to be operably engaged with the fuse 110.

Figure 7:
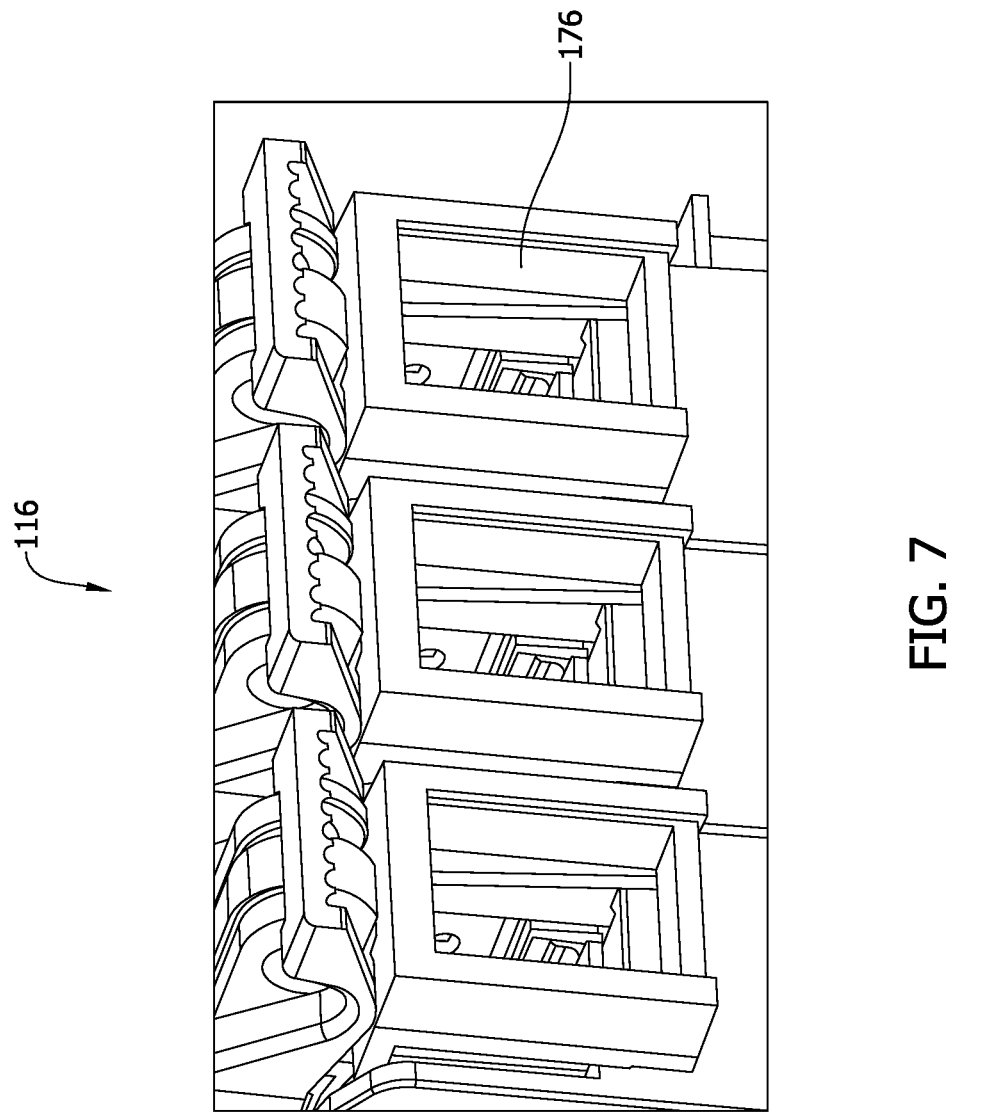
FIG. 7 is a detailed view of the fuse monitoring assembly showing the current sensor.

FIG. 7 is a detailed view of the housing 202 showing the current sensor 176 of the assembly 116. The housing 202 supports the current sensor 176 which uses a magnetic field to detect the current in the fuse 110. The current sensor 176 measures the current of the fuse passively, without interrupting the circuit of the fuse 110. In the illustrated embodiment, the assembly 116 includes three current sensor 176 to monitor each of the three of the fuses 110. Greater or fewer numbers of current sensors (including one and only one current sensor) could likewise be provided in alternative embodiments).

Figure 8A:
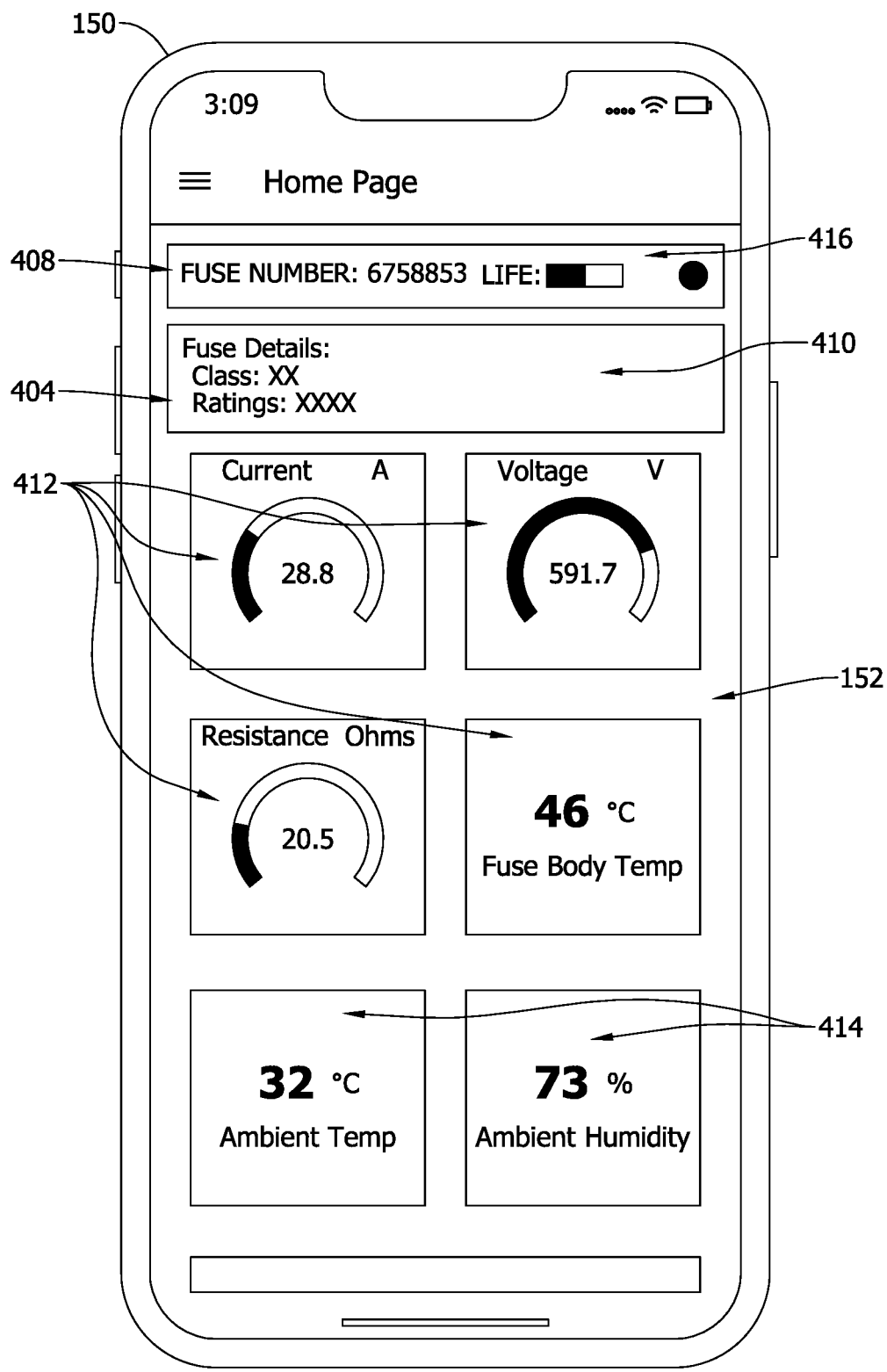
FIGS. 8A and 8B illustrate a plurality of views of an exemplary user interface used to monitor a fuse with the system shown in FIG. 1.
Figure 8B:
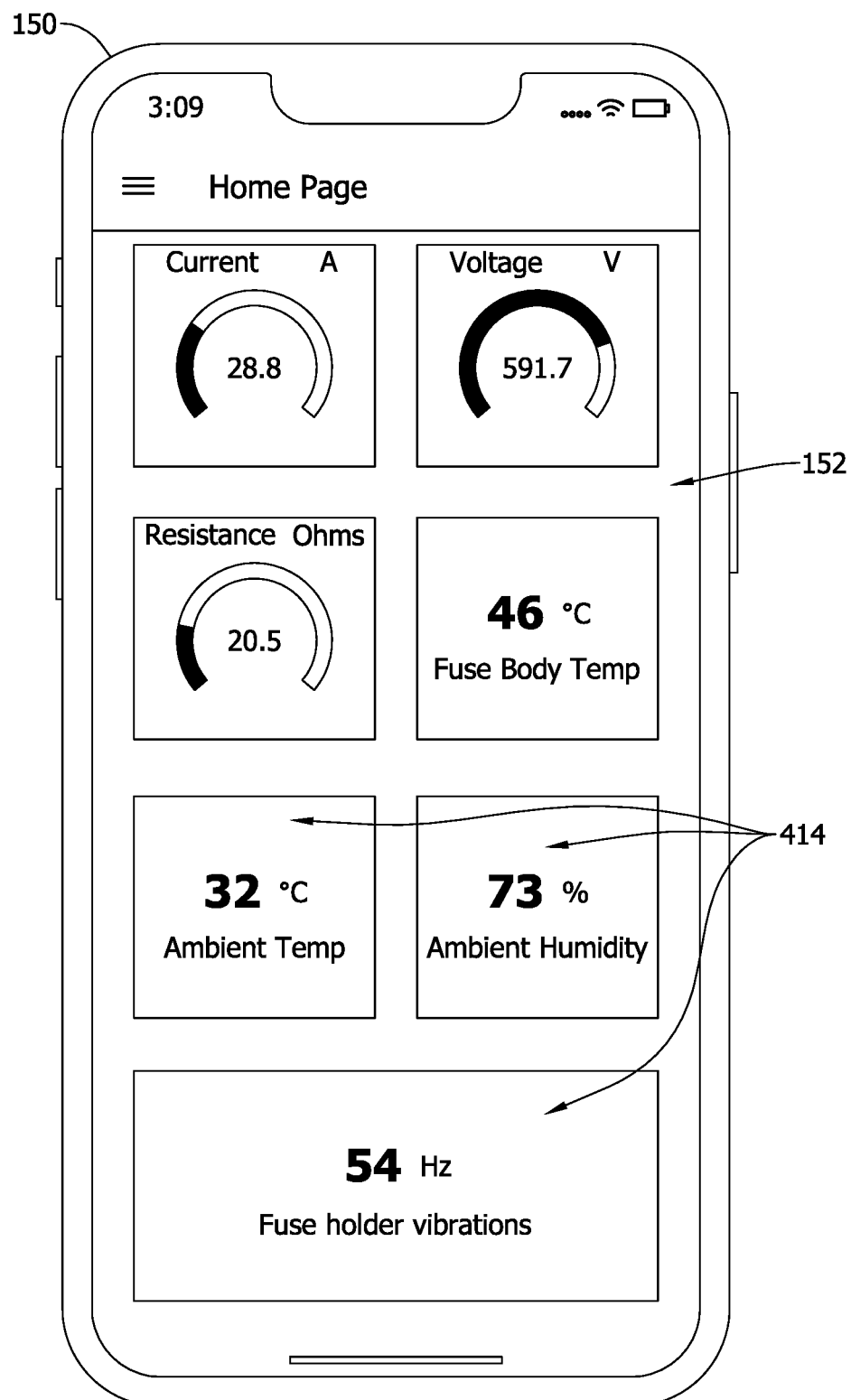

FIGS. 8A and 8B illustrates a plurality of views of an exemplary user interface 152, displayed on the user computing device 150. The user interface 152 enables monitoring of the fuse 110 using the system 100 shown in FIG. 1. In the exemplary embodiment, the user interface 152 may be displayed on any suitable user computing device 150 enabling a user to monitor the fuse 110. For example, the user interface 152 may be displayed on a dashboard screen or information screen associated with the EV 112.

In reference to FIG. 8A, a first view 404 of the user interface 152 includes a fuse identification number 408 that uniquely identifies the fuse 110 being monitored by the system 100. The user interface 152 also displays one or more fuse details 410 that may be used to identify the fuse 110, such as a fuse class, a fuse rating, and/or any other details regarding the fuse 110. For example, in some embodiments, the user interface 152 may display a location of the fuse 110, an application of the fuse 110 (e.g., EV or industrial), and/or an installation date of the fuse 110. The user interface 152 may display any suitable fuse details 410 that enable the system 100 to function as described herein.

In the exemplary embodiment, the user interface 152 displays real-time fuse performance parameters 412 and real-time environmental conditions 414 of the fuse 110, measured by the one or more sensors 120. The real-time fuse performance parameters 412, including voltage, current, resistance, and fuse body temperature, are graphically displayed using both a metered gauge and a digital display. The real-time environmental conditions 414 of the fuse 110 are digitally displayed. The real-time environmental conditions displayed include ambient temperature, ambient humidity, and fuse holder vibrations. The user interface 152 also displays the remaining service life 416 using a scale to illustrate a percent remaining service life. The user interface 152 may display real-time fuse performance parameters 412 and real-time environmental conditions 414 of the fuse 110 using any suitable graphical or digital displays. Additionally, the user interface 152 may display any suitable data that enables system 100 to function as described herein. In some example embodiments, the user interface 152 may display one or more determined metrics, e.g., average ambient temperature.

In some embodiments, the user interface 152 may be interactive, allowing a user to submit one or more query messages to the computing device 130. For example, the user interface 152 may include one or more user inputs, such as buttons, toggles, and/or drop down menus, enabling a user to select information to be displayed on the user interface 152. For example, a user may desire to know a peak voltage at which the fuse 110 will fail, the user may engage with the system 100 via the user interface 152 to obtain this information, i.e., a query message is transmitted from the user computing device 150 to the computing device 130 and the computing device 130 may retrieve data that is stored within the historical fuse database 140, and then the computing device 130 transmits a message to the user computing device 150 to be displayed on the user interface 152.

Figure 9:
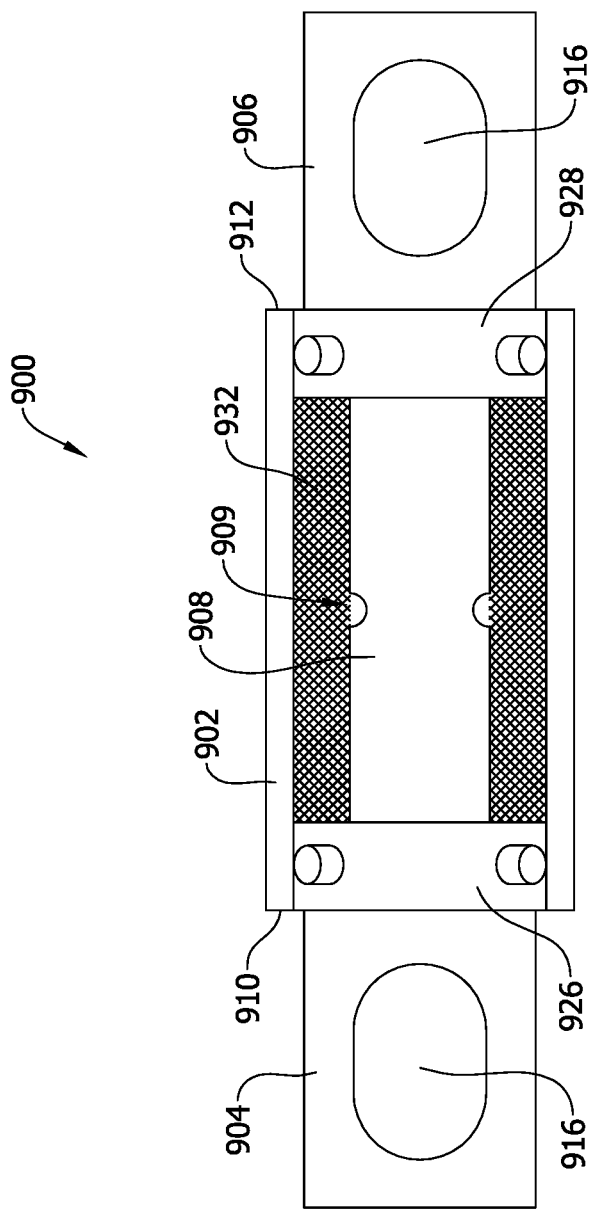
FIG. 9 is a top plan view of a high voltage power fuse that may be used with the fuse monitoring system shown in FIGS. 1 and 2.

FIG. 9 is a top plan view of an exemplary high voltage power fuse 900 (e.g., fuse 110) that is designed for use with an EV power system for an EV 112. The fuse 110 may experience a variety of current profiles based, at least in part, on the how the EV 112 is driven. For example, greater and more frequent accelerations of the EV 112 will cause more current and voltage fluctuations than less frequent and lower accelerations. As shown in FIG. 9, the power fuse 900 of the disclosure includes a housing 902, terminal blades 904, 906 configured for connection to a line and a load side circuitry, and a fuse element 908 including a fuse element week-spot 909 that completes an electrical connection between the terminal blades 904, 906. When subjected to predetermined current conditions, at least a portion of the fuse element 908 melts, disintegrates, or otherwise structurally fails and opens the circuit path between the terminal blades 904, 906. The load side circuitry is therefore electrically isolated from the line side circuitry to protect the load side circuit components and the circuit from damage when electrical fault conditions occur.

The fuse 900 in one example is engineered to provide a predetermined voltage rating and a current rating suitable for use in an electrical power system of an electric vehicle in a contemplated embodiment. In one example, the housing 902 is fabricated from a non-conductive material known in the art such as glass melamine in one exemplary embodiment. Other known materials suitable for the housing 902 could alternatively be used in other embodiments as desired. Additionally, the housing 902 shown is generally cylindrical or tubular and has a generally circular cross-section along an axis parallel to length of the terminal blades 904, 906 in the exemplary embodiment shown. The housing 902 may alternatively be formed in another shape if desired, however, including but not limited to a rectangular shape having four side walls arranged orthogonally to one another, and hence having a square or rectangular-shaped cross section. The housing 902 as shown includes a first end 910, a second end 912, and an internal bore or passageway between the opposing ends 910, 912 that receives and accommodates the fuse element 908.

In some embodiments the housing 902 may be fabricated from an electrically conductive material if desired, although this would require insulating gaskets and the like to electrically isolate the terminal blades 904, 906 from the housing 902.

The terminal blades 904, 906 respectively extend in opposite directions from each opposing end 910, 912 of the housing 902 and are arranged to extend in a generally co-planar relationship with one another. Each of the terminal blades 904, 906 may be fabricated from an electrically conductive material such as copper or silver or suitable metal alloys in contemplated embodiments. Other known conductive materials may alternatively be used in other embodiments as desired to form the terminal blades 904, 906. Each of the terminal blades 904, 906 is formed with an aperture 914, 916 as shown in FIG. 3, and the apertures 914, 916 may receive a fastener such as a bolt (not shown) to secure the fuse 900 in place in an EV and establish line and load side circuit connections to circuit conductors via the terminal blades 904, 906.

While exemplary terminal blades 904, 906 are shown and described for the fuse 900, other terminal structures and arrangements may likewise be utilized in further and/or alternative embodiments. For example, the apertures 914, 916 may be considered optional in some embodiments and may be omitted. Knife blade contacts may be provided in lieu of the terminal blades as shown, as well as ferrule terminals or end caps as those in the art would appreciate to provide various different types of termination options. The terminal blades 904, 906 may also be arranged in a spaced apart and generally parallel orientation if desired and may project from the housing 902 at different locations than those shown.

In various embodiments, the end plates 926, 928 may be formed to include the terminal blades 904, 906 or the terminal blades 904, 906 may be separately provided and attached. The end plates 926, 928 may be considered optional in some embodiments and connection between the fuse element 908 and the terminal blades 904, 906 may be established in another manner.

An arc quenching medium or material 932 surrounds the fuse element 908. The arc quenching medium 932 may be introduced to the housing 902 via one or more fill openings in one of the end plates 926, 928 that are sealed with plugs (not shown). The plugs may be fabricated from steel, plastic or other materials in various embodiments. In other embodiments a fill hole or fill holes may be provided in other locations, including but not limited to the housing 902 to facilitate the introduction of the arc quenching medium 932.

In one contemplated embodiment, the arc quenching medium 932 includes quartz silica sand and a sodium silicate binder. The quartz sand has a relatively high heat conduction and absorption capacity in its loose compacted state, but can be silicated to provide improved performance. For example, by adding a liquid sodium silicate solution to the sand and then drying off the free water, silicate arc quenching medium 932 may be obtained with the following advantages.

The arc quenching medium 932 creates a thermal conduction bond of sodium silicate to the fuse element 908, the quartz sand, the fuse housing 902 and the end plates 926 and 928. This thermal bond allows for higher heat conduction from the fuse element 908 to its surroundings, circuit interfaces and conductors. The application of sodium silicate to the quartz sand aids with the conduction of heat energy out and away from the fuse element 908.

The sodium silicate mechanically binds the sand to the fuse element, terminal and housing tube increasing the thermal conduction between these materials. Conventionally, a filler material which may include sand only makes point contact with the conductive portions of the fuse element in a fuse, whereas the silicated sand of the arc quenching medium 932 is mechanically bonded to the fuse element. Much more efficient and effective thermal conduction is therefore made possible by the silicated arc quenching medium 932.

The fuse elements described in the fuse 900 utilize metal stamped or punched fuse elements, present some concern for EV applications including the type of cyclic current loads described above. Such stamped fuse element designs whether fabricated from copper or silver or copper alloys undesirably introduce thermal-mechanical strains and stresses on the fuse element weak-spots 909 such that a shortened service life tends to result than if the fuse 900 were used in another power system having a different current load. This shortened fuse service life manifests itself in the form of nuisance fuse operation resulting from the thermal-mechanical fatigue of the fuse element at the weak-spots 909.

In a contemplated system of the disclosure, the measurement of the fuse resistance may be made with precision by injecting a known currents across the fuse element 908. That is, the system may measure the non-linear fuse resistance while it is in service, and algorithms may be developed to assess the changes in resistance and estimate a temperature of the fuse element 908 based on the resistance of the fuse 900 and the ambient thermal conditions, as will be described further below.

Figure 10:
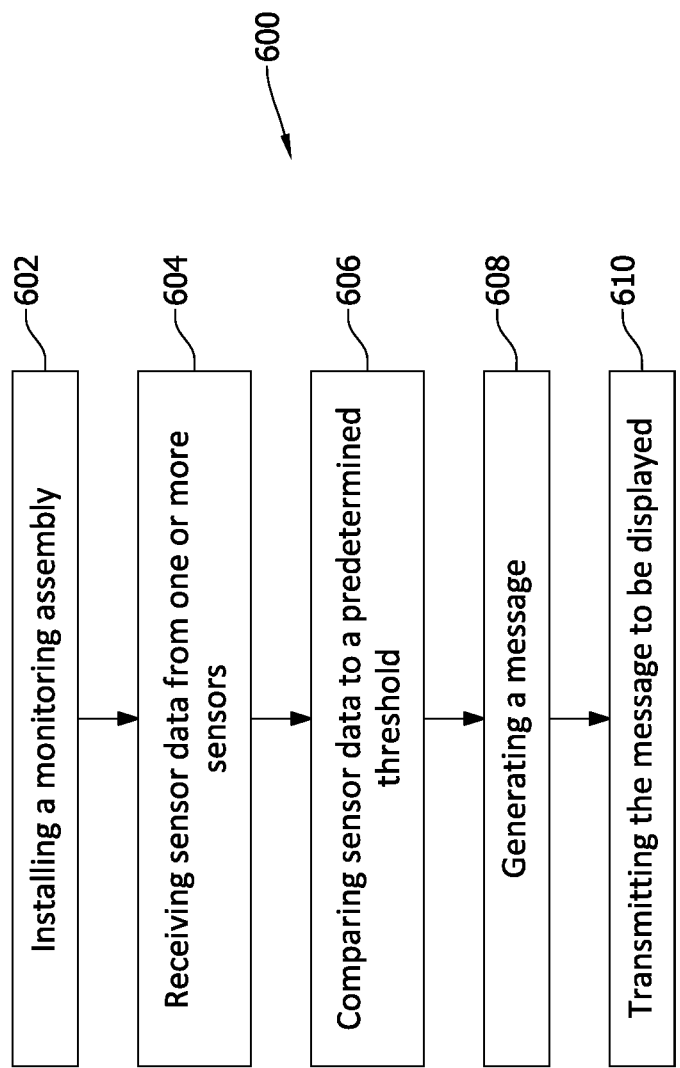
FIG. 10 is an exemplary flow chart of an exemplary process of monitoring a fuse.

FIG. 10 is a flowchart of an exemplary method 600 of monitoring the fuse 110. The method 600 monitors performance of the fuses, as well as environmental parameters of the fuses in order to optimize the performance of the fuses or provide fuses that suited for the environment. The method 600 includes installing 602 the assembly 116 in proximity to the fuse 110. The assembly 116 includes the housing 202 defining a housing cavity 208 storing the one or more sensors 120 therein. Installing 602 may include positioning the assembly 116 in proximity to the fuse 110 and/or connecting the assembly 116 to the fuse housing 200.

In some embodiments, installation 602 includes positioning, in proximity to the fuse 110, the one or more sensors 120 configured to measure the environmental conditions to which the fuse 110 is exposed and/or the fuse performance parameters. Specifically, method 600 may include installing 602 the ambient temperature sensor 162, the humidity sensor 164, the accelerometer near the fuse 110. Installing 602 include operably coupling the fuse temperature sensor, current sensor 176, the voltage sensor 174, and/or the resistance sensor 172 to the fuse 110.

The method 600 includes receiving 604, at the computing device 130, the sensor data 132 from the one or more sensors 120 of the assembly 116. Receiving 604 the sensor data 132 may include receiving sensor data 132 periodically at regularly scheduled interval and/or continuously.

The method 600 includes comparing 606, using the computing device 130, the received sensor data 132 to one or more predetermined thresholds. In some embodiments, the predetermined threshold is a level of above which the fuse 110 is not safe to be in use and needs to be replaced. The predetermined threshold is contemplated to be different for various measured parameters, i.e., the environmental conditions and the fuse performance parameters. In another example, the predetermine thresholds are ranges, such as ranges of humidity. The measured humidity data may show the humidity of the environment around the fuse is at the margin of the range, indicating a fuse that tolerates an increased humidity range or a different humidity range is needed. In one more example, the measured operation data may indicate the usage of the fuse such as installation is incorrect by comparing the operational parameters with predetermined thresholds. In another example, the measured shock may be compared to a threshold shock. In some embodiments, the threshold shock may be 2 g. A measured shock greater than the threshold may indicate that the EV 112 traverses a particularly uneven terrain, the EV 112 experiences an impact, or the fuse 110 is exposed to a shock that exceeds the threshold.

In some embodiments, the sensors 120 measure parameters associated with the fuse 110, and then, the computing device 130 compares the measured sensor data 132 to one or more threshold values associated with a maximum service life. The maximum service life may be associated with a service life of the fuse, if the fuse is exposed to conditions which do not exceed the one or more predetermine threshold values. In other words, exposure of the fuse 110 to conditions above the predetermine thresholds may result in a decreased service life that is shorter than the maximum service life. In some embodiments, the conditions to which the fuse 110 is exposed may be compared to similar historical conditions to which a historical fuse was exposed. If a similar historical condition existed, the service life of the historical fuse may be used to determine a predicted service life of the fuse 110 that is being monitored. For example, an historical fuse may have been exposed to a environmental condition which exceeded the predetermined threshold for an extended period of time resulting in a decreased and/or shortened service life of the historical fuse. The computing device 130 may determine that the fuse 110 is also exposed to the same environmental condition exceeding the threshold and accordingly the computing device 130 may determine that the fuse 110 will also have a similar shortened lifespan.

In some embodiments, the method 600 includes determining, using the computing device 130, one or more metrics based on, at least in part, on the received sensor data 132. The method 600 may further include comparing the determined metrics to a predetermined threshold. For example, the method 600 may include determining an average temperature using temperature data received from the temperature sensor over a period of time. The method 600 may include comparing the average temperature data to a predetermined average temperature threshold.

The method 600 includes generating 608 a message using the computing device 130. The message may include the sensor data 132, one or more determined metrics, and/or a warning. The warning is included in the message when the computing device 130 determined that the sensor data 132 exceeded the predetermined threshold. The method 600 includes the computing device 130 transmitting 610 the message to the user computing device 150. The message may also include instructions that cause at least a portion of the content of the message to be displayed on the user interface 152.

In some embodiments, the method 600 includes determining, using the computing device 130, one or more of a preventive maintenance recommendation based on the comparison 606. For example, if the sensor data 132 exceeds the predetermined threshold, preventive maintenance is recommended to be performed on the fuse 110, e.g., replace fuse. In yet another example, if the level of voltage is below the predetermined threshold, fuse monitoring is continued. In some embodiments, the computing device 130 may recommended a fuse type for a replacement fuse or a proper fuse. For example, if the humidity level is above a threshold level, the fuse in use may not tolerate the humidity level and may prematurely fail. A proper type of fuses that are suited for the humidity level may be determined and communicated to a user. In some embodiments, the computing device 130 incorporates the preventive maintenance recommendation into the message transmitted to the user computing device 150. The preventative maintenance recommendation may also include a warning that indicates the need to control or adjust the conditions to which the fuse 110 is exposed. For example, if the fuse 110 has been exposed to a temperature which exceeds the threshold temperature the preventative maintenance recommendation may recommending cooling and/or shutting off the EV 112 until the temperature is below the threshold temperature.

In yet another example, the preventative maintenance recommendation may be associated with fuse inventory management. For example, the computing device 130 may determine that the sensor data 132 has crossed one or more predetermined thresholds, and accordingly, the computing device 130 may recommend purchasing one or more new fuses 110 that may be used to replace the fuse that is being monitored. The computing device 130 may be communicatively coupled to a fuse inventory database such that the computing device 130 may query the inventory database to determine the quantity and types of fuses that are stored.

Figure 11:
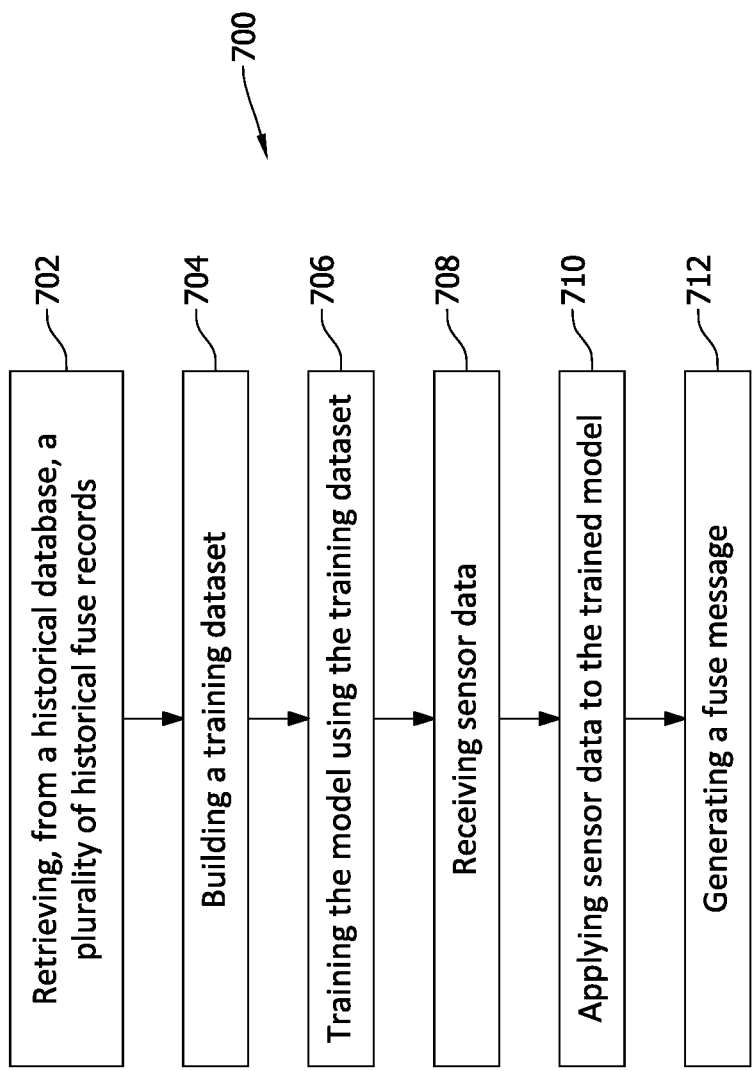
FIG. 11 is an exemplary flow chart of an exemplary process of predicting a fuse service life.

FIG. 11 is a flowchart of an exemplary method 700 for monitoring the fuse 110. The method 700 includes retrieving 702, by the computing device 130, from the historical fuse database 140, a plurality of historical fuse records 142. Each of the historical fuse records 142 includes a fuse type, a fuse application, a fuse service life, and/or historical fuse data collected by the one or more sensors 120. The historical fuse records 142 may include one more metrics that determined by the computing device 130, e.g., an average temperature, humidity, and/or pressure.

The method 700 includes the computing device 130 building 704, from the retrieved plurality of historical fuse records 142, a training dataset for training a model. In some embodiments, the method 700 includes building a fuse specific training datasets which includes a plurality of historical fuse records associated with a specific type of fuse or a specific type of fuse application. For example, the method 700 may include building 704 a EV training dataset associated with fuses used in EV applications. In yet another example, the method 700 may include building 704 an industrial training dataset associated with fuses used in industrial applications.

In the exemplary embodiment, the method 700 includes training 706 the model using the training dataset. The model may be trained using a machine learning algorithm. The model is configured to receive one or more inputs and determine one or more outputs. The one or more inputs include real-time parameters associated with the fuse 110 that is being monitored. Real-time parameters may include environmental conditions to which the fuse 110 is exposed. Real-time parameters may include fuse performance parameters. The one or more outputs may include a remaining service life, a remaining number of service life cycles, and/or a fuse recommendation.

In some embodiments, the method 700 does not include retrieving 702, building 704, and training 706. A model that has been trained and/or stored in a separate computing device or in the same computing device is provided and is used to analyze the sensor data detected by the fuse monitoring assembly 116.

The method 700 includes receiving 708, at the computing device 130, from one or more sensors 120, sensor data 132. The sensors 120 measure, in real-time, the environmental conditions to which the fuse 110 is exposed. The sensor may also measure, in real-time, the fuse 110 performance parameters. The method 700 includes applying 710 the sensor data 132 as the inputs to the model.

In the exemplary embodiment, the method 700 further includes analyzing the sensor data 132 using the trained model. The trained model outputs remaining service life, a remaining number of service life cycles, the functioning of the fuse, and/or a fuse recommendation based on the sensor data. The functioning of the fuse may include at least one of fuse failure or the fuse is still functioning. If the fuse has failed, the output may include a reason, such as, the fuse is blow, the fuse is short-circuited, the fuse is overload, the fuse has faulted, and/or an incorrect fuse was installed.

In some embodiments, the method 700 includes determining one or more metrics using the received sensor data 132. The method 700 may include applying the determined metrics as inputs to the trained mode and applying the model includes obtaining the outputs.

The method 700 includes the computing device 130 generating 712 a fuse message. The fuse message includes outputs obtained from applying 710 the model to the inputs. The fuse message may include the predicted remaining service life of the fuse 110. In some embodiments, the message includes a recommended fuse type. In some embodiments, the message includes sensor data 132, determined metrics. In one embodiment, the fuse message may further include maintenance recommendation generated in method 600 of monitoring a fuse. The maintenance recommendation may be updated or modified based on the predicted life or life cycles of the fuse and/or fuse recommendations. For example, if the predicted remaining life is one month, the fuse message may include a recommendation of checking the inventory of fuses to ensure back-up fuses are available when the fuse fails and/or a recommendation of increasing the frequency of physical inspection of the fuse.

In some embodiments, the method 600, 700 further includes generating and providing an alert to the user computing device 150 or the computing device 130 about the performance, the life, and maintenance of the fuse. For example, if the remaining life of the fuse is limited, such as days, an alert may be sent to the user computing device 150 of the computing device 130. The alert may be visual, audio, and/or haptic.

Figure 12:
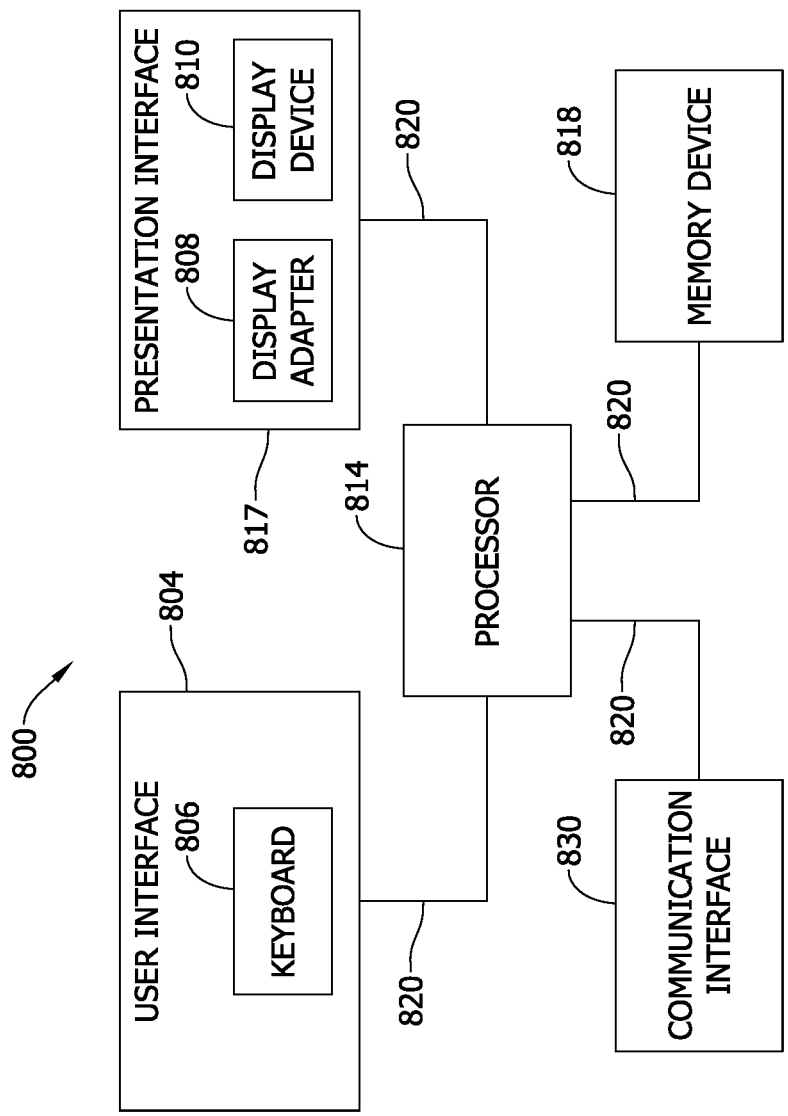
FIG. 12 is a block diagram of an exemplary user computing device.

The user computing device 150 described herein may be any suitable user computing device 800 and software implemented therein. FIG. 12 is a block diagram of an exemplary computing device 800. In the exemplary embodiment, the computing device 800 includes a user interface 804 (e.g., user interface 152) that receives at least one input from a user. The user interface 804 may include a keyboard 806 that enables the user to input pertinent information. The user interface 804 may also include, for example, a pointing device, a mouse, a stylus, a touch sensitive panel (e.g., a touch pad and a touch screen), a gyroscope, an accelerometer, a position detector, and/or an audio input interface (e.g., including a microphone).

Moreover, in the exemplary embodiment, computing device 800 includes a presentation interface 817 (e.g., user interface 152) that presents information, such as input events and/or validation results, to the user. The presentation interface 817 may also include a display adapter 808 that is coupled to at least one display device 810. More specifically, in the exemplary embodiment, the display device 810 may be a visual display device, such as a cathode ray tube (CRT), a liquid crystal display (LCD), a light-emitting diode (LED) display, and/or an "electronic ink" display. Alternatively, the presentation interface 817 may include an audio output device (e.g., an audio adapter and/or a speaker) and/or a printer.

The computing device 800 also includes a processor 814 and a memory device 818. The processor 814 is coupled to the user interface 804, the presentation interface 817, and the memory device 818 via a system bus 820. In the exemplary embodiment, the processor 814 communicates with the user, such as by prompting the user via the presentation interface 817 and/or by receiving user inputs via the user interface 804. The term "processor" refers generally to any programmable system including systems and microcontrollers, reduced instruction set computers (RISC), complex instruction set computers (CISC), application specific integrated circuits (ASIC), programmable logic circuits (PLC), and any other circuit or processor capable of executing the functions described herein. The above examples are exemplary only, and thus are not intended to limit in any way the definition and/or meaning of the term "processor."

In the exemplary embodiment, the memory device 818 includes one or more devices that enable information, such as executable instructions and/or other data, to be stored and retrieved. Moreover, the memory device 818 includes one or more computer readable media, such as, without limitation, dynamic random access memory (DRAM), static random access memory (SRAM), a solid state disk, and/or a hard disk. In the exemplary embodiment, the memory device 818 stores, without limitation, application source code, application object code, configuration data, additional input events, application states, assertion statements, validation results, and/or any other type of data. The computing device 800, in the exemplary embodiment, may also include a communication interface 830 that is coupled to the processor 814 via the system bus 820. Moreover, the communication interface 830 is communicatively coupled to data acquisition devices.

In the exemplary embodiment, the processor 814 may be programmed by encoding an operation using one or more executable instructions and providing the executable instructions in the memory device 818. In the exemplary embodiment, the processor 814 is programmed to select a plurality of measurements that are received from data acquisition devices.

In operation, a computer executes computer-executable instructions embodied in one or more computer-executable components stored on one or more computer-readable media to implement aspects of the invention described and/or illustrated herein. The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Figure 13:
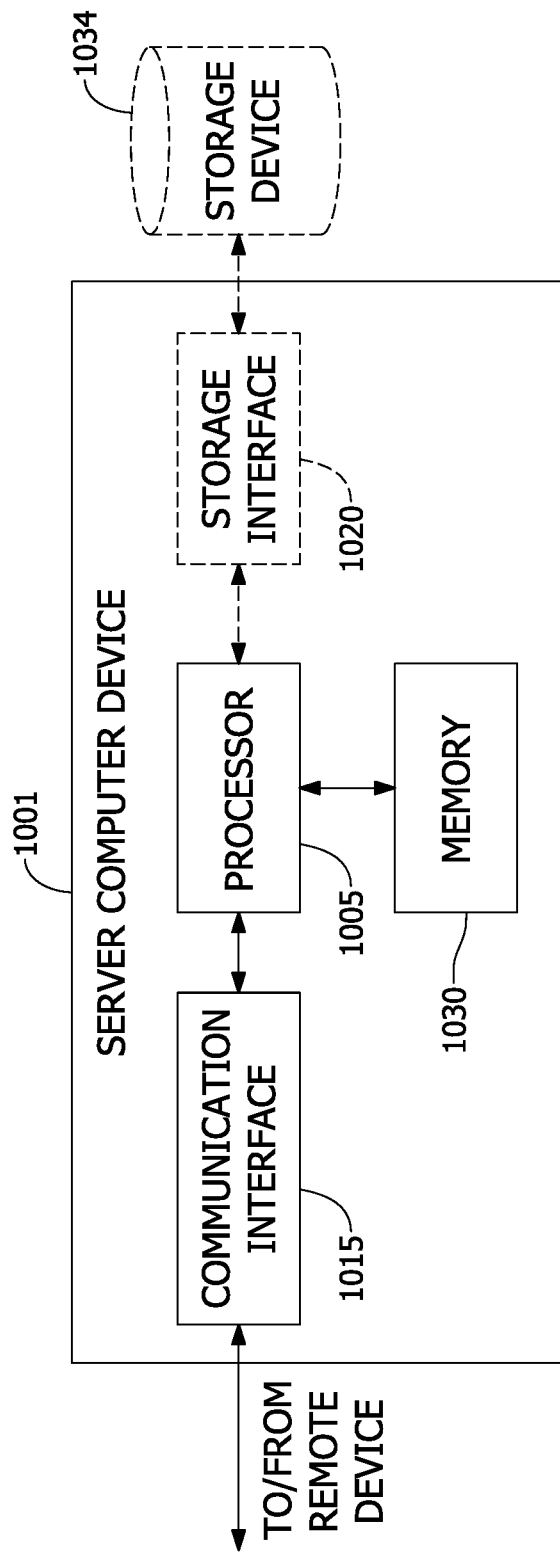
FIG. 13 is a block diagram of an exemplary server computing device.

FIG. 13 illustrates an exemplary configuration of a computer device 1001 such as the computing device 130 The server computer device 1001 also includes a processor 1005 for executing instructions. Instructions may be stored in a memory area 1030, for example. The processor 1005 may include one or more processing units (e.g., in a multi-core configuration).

The processor 1005 is operatively coupled to a communication interface 1015 such that server computer device 1001 is capable of communicating with a remote device such as the processor 118 and/or the one or more sensor 120, or another server computer device 1001. For example, communication interface 1015 may receive data from the processor 118 and the one or more sensors 120, via the Internet.

The processor 1005 may also be operatively coupled to a storage device 1034. The storage device 1034 is any computer-operated hardware suitable for storing and/or retrieving data, such as, but not limited to, wavelength changes, temperatures, and strain. In some embodiments, the storage device 1034 is integrated in the server computer device 1001. For example, the server computer device 1001 may include one or more hard disk drives as the storage device 1034. In other embodiments, the storage device 1034 is external to the server computer device 1001 and may be accessed by a plurality of server computer devices 1001. For example, the storage device 1034 may include multiple storage units such as hard disks and/or solid state disks in a redundant array of inexpensive disks (RAID) configuration. The storage device 1034 may include a storage area network (SAN) and/or a network attached storage (NAS) system.

In some embodiments, the processor 1005 is operatively coupled to the storage device 1034 via a storage interface 1020. The storage interface 1020 is any component capable of providing the processor 1005 with access to the storage device 1034. The storage interface 1020 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing the processor 1005 with access to the storage device 1034.

In some embodiments, the processor 1005 includes a user interface 134 (shown in FIGS. 1 and 2) that receives at least one input from a user. The user interface 134 may include a keyboard that enables the user to input pertinent information. The user interface 134 may also include, for example, a pointing device, a mouse, a stylus, a touch sensitive panel (e.g., a touch pad and a touch screen), a gyroscope, an accelerometer, a position detector, and/or an audio input interface (e.g., including a microphone). The user interface 134 may present information, such as input events and/or validation results, to the user. The user interface 134 may also include a display adapter that is coupled to at least one display device. More specifically, in the exemplary embodiment, the display device may be a visual display device, such as a cathode ray tube (CRT), a liquid crystal display (LCD), a light-emitting diode (LED) display, and/or an "electronic ink" display. Alternatively, the presentation interface 817 may include an audio output device (e.g., an audio adapter and/or a speaker) and/or a printer.

The benefits and advantages of the inventive concepts are now believed to have been amply illustrated in relation to the exemplary embodiments disclosed.

At least one technical effect of the systems and methods described herein includes (a) monitoring of fuses operated in an electric vehicle; (b) real-time monitoring of fuses; (c) fuse monitoring using at least one sensor configured to measure operational paraments and environmental conditions; (d) predicting life of a fuse based on operational data and environmental data associated with the fuse; and (e) providing a user with preventive or proactive measures to protect electrical power systems based on the performance and remaining life of the fuse obtained during fuse monitoring.

An embodiment of a fuse monitoring system for monitoring a fuse is disclosed. The system includes a fuse monitoring assembly and a fuse monitoring computing device. The fuse monitoring assembly includes at least one sensor configured to measure fuse data associated with the fuse, the fuse data including operational data of the fuse and environmental data of an environment in which the fuse locates, the environmental data including shock and vibrations. The fuse monitoring assembly also includes at least one processor communicatively coupled to the at least one sensor, the at least one processor configured to transmit the fuse data to a remote computing device. The fuse monitoring computing device is positioned remotely from the fuse monitoring assembly, the fuse monitoring computing device including at least one processor in communication with at least one memory device. The fuse monitoring computing device is programmed to receive, from the fuse monitoring assembly, the fuse data, analyze the fuse data, and generate a fuse message based on the analysis.

Optionally, the operational data include a current, a voltage, a resistance, and a temperature of the fuse. The environmental data further includes an ambient temperature and humidity of the environment. The fuse monitoring computing device is further programmed to apply a fuse model to the fuse data by inputting the fuse data into the fuse model configured to predict a remaining life of the fuse based on the operational data and the environmental data, and obtaining an output from the fuse model, the output including the remaining life of the fuse. The fuse monitoring computing device is further programmed to generate the fuse message including the remaining life. The fuse monitoring computing device is further programmed to apply a trained fuse model to the fuse data. The fuse monitoring computing device is further programmed to retrieve, from a historical fuse database, a plurality of fuse records, each fuse record including at least one of operational data or environmental data associated with a historical fuse, each fuse record further including a life of the historical fuse, generate, from the plurality of fuse records, a training dataset, and train the fuse model using the training dataset. The fuse monitoring computing device is further programmed to generate the fuse message including a maintenance recommendation based on the analysis. The fuse monitoring computing device is further programmed to compare the fuse data with a plurality of thresholds, and generate the fuse message based on the comparison. The fuse monitoring computing device is further programmed to generate the fuse message including a recommended alternative fuse type. The fuse monitoring computing device is further programmed to transmit the fuse message to a user computing device. The fuse monitoring computing device is configured to transmit the fuse data to a remote computing device having a user interface configured to display the fuse data. The fuse monitoring assembly and the fuse monitoring computing device are connected as Internet of Things (IoT). The fuse monitoring computing device is further programmed to generate an alert based on the analysis. The fuse monitoring assembly is modular.

An embodiment of a fuse monitoring assembly for monitoring a fuse is disclosed. The assembly includes at least one sensor and at least one processor. The at least one sensor is configured to measure fuse data associated with the fuse, the fuse data including operational data of the fuse and environmental data of an environment in which the fuse locates, the environmental data including shock and vibrations. The at least one processor is communicatively coupled to the at least one sensor, the processor configured to transmit the fuse data to a remote computing device.

Optionally, the at least one sensor is further configured to measure current, voltage, resistance, and temperature of the fuse. The at least one sensor is further configured to measure ambient temperature and humidity of the environment. The assembly is modular. The fuse monitoring assembly is configured to be installed on a fuse of an electrical vehicle. The at least one processor is configured to transmit the fuse data to the remote computing device having a user interface configured to display the fuse data.

While exemplary embodiments of components, assemblies and systems are described, variations of the components, assemblies and systems are possible to achieve similar advantages and effects. Specifically, the shape and the geometry of the components and assemblies, and the relative locations of the components in the assembly, may be varied from that described and depicted without departing from inventive concepts described. Also, in certain embodiments, certain components in the assemblies described may be omitted to accommodate particular types of fuses or the needs of particular installations, while still providing the needed performance and functionality of the fuses.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A fuse monitoring system for monitoring a fuse, the system comprising:
a fuse monitoring assembly comprising:
at least one sensor configured to measure fuse data associated with the fuse, the fuse data including operational data of the fuse and environmental data corresponding to an environment in which the fuse is located, the environmental data including data associated with shock and vibrations; and
at least one processor communicatively coupled to the at least one sensor, the at least one processor configured to transmit the fuse data to a remote computing device; and
a fuse monitoring computing device positioned remotely from the fuse monitoring assembly, the fuse monitoring computing device comprising at least one processor in communication with at least one memory device, the fuse monitoring computing device being programmed to:
receive, from the fuse monitoring assembly, the fuse data;
determine an estimated remaining fuse service life of the fuse by analyzing the fuse data using a combination of a physics model and a machine-learning model; and
generate a fuse message based on the analysis.

2. The system of claim 1, wherein the operational data include a current, a voltage, a resistance, and a temperature of the fuse.

3. The system of claim 1, wherein the environmental data further includes an ambient temperature and humidity of the environment.

4. The system of claim 1, wherein the fuse monitoring computing device is further programmed to:
apply a fuse model to the fuse data by:
inputting the fuse data into the fuse model configured to predict the remaining life of the fuse based on the operational data and the environmental data; and
obtaining an output from the fuse model, the output including the remaining life of the fuse; and
generate the fuse message including the remaining life.

5. The system of claim 4, wherein the fuse monitoring computing device is further programmed to:
retrieve, from a historical fuse database, a plurality of fuse records, each fuse record including at least one of operational data or environmental data associated with a historical fuse, and each fuse record further including a life of the historical fuse;
generate, from the plurality of fuse records, a training dataset; and
train the fuse model using the training dataset.

6. The system of claim 1, wherein the fuse monitoring computing device is further programmed to generate the fuse message including a maintenance recommendation based on the analysis.

7. The system of claim 1, wherein the fuse monitoring computing device is further programmed to:
compare the fuse data with a plurality of thresholds; and
generate the fuse message based on the comparison.

8. The system of claim 1, wherein the fuse monitoring computing device is further programmed to:
generate the fuse message including a recommended alternative fuse type.

9. The system of claim 1, wherein the fuse monitoring computing device is further programmed to transmit the fuse message to a user computing device.

10. The system of claim 1, wherein the fuse monitoring computing device is configured to transmit the fuse data to a remote computing device having a user interface configured to display the fuse data.

11. The system of claim 1, wherein the fuse monitoring assembly and the fuse monitoring computing device are connected as Internet of Things (IoT).

12. The system of claim 1, wherein the fuse monitoring computing device is further programmed to:
generate an alert based on the analysis.

13. The system of claim 1, wherein the fuse monitoring assembly is modular.

14. A fuse monitoring assembly for monitoring a fuse, the assembly comprising:
at least one sensor configured to measure fuse data associated with the fuse, the fuse data including operational data of the fuse and environmental data corresponding to an environment in which the fuse is located, the environmental data including data associated with shock and vibrations; and
at least one processor communicatively coupled to the at least one sensor, the at least one processor configured to transmit the fuse data to a remote computing device, wherein the fuse data is analyzed by the remote computing device, using a combination of a physics model and a machine-learning model, in part to determine an estimated remaining fuse service life of the fuse.

15. The assembly of claim 14, wherein the at least one sensor is further configured to measure current, voltage, resistance, and temperature of the fuse.

16. The assembly of claim 14, wherein the at least one sensor is further configured to measure ambient temperature and humidity of the environment.

17. The assembly of claim 14, wherein the assembly is modular.

18. The assembly of claim 17, wherein the fuse monitoring assembly is configured to be installed on a fuse of an electrical vehicle.

19. The assembly of claim 14, wherein the at least one processor is configured to transmit the fuse data to the remote computing device having a user interface configured to display the fuse data.

20. The system of claim 1, wherein the physics model is used to increase a confidence level of determining the estimated remaining fuse service life of the fuse based on the machine-learning model.

* * * * *